(12) United States Patent
Yang et al.

(10) Patent No.: US 11,385,984 B2
(45) Date of Patent: Jul. 12, 2022

(54) VARIABLE READ SCAN FOR SOLID-STATE STORAGE DEVICE QUALITY OF SERVICE

(71) Applicant: Western Digital Technologies, Inc., San Jose, CA (US)

(72) Inventors: Nian Yang, Mountain View, CA (US); Piyush Dhotre, San Jose, CA (US); Sahil Sharma, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 153 days.

(21) Appl. No.: 16/798,650

(22) Filed: Feb. 24, 2020

(65) Prior Publication Data

US 2021/0263821 A1 Aug. 26, 2021

(51) Int. Cl.
| G06F 11/30 | (2006.01) |
| G06F 11/07 | (2006.01) |
| G06F 11/10 | (2006.01) |
| G06F 9/48 | (2006.01) |
| G06F 11/14 | (2006.01) |
| G06F 1/20 | (2006.01) |
| G06F 12/0882 | (2016.01) |

(52) U.S. Cl.
CPC .......... *G06F 11/3058* (2013.01); *G06F 1/206* (2013.01); *G06F 9/4881* (2013.01); *G06F 11/076* (2013.01); *G06F 11/106* (2013.01); *G06F 11/1072* (2013.01); *G06F 11/142* (2013.01); *G06F 11/3037* (2013.01); *G06F 12/0882* (2013.01)

(58) Field of Classification Search
CPC ............ G06F 11/3058; G06F 11/3037; G06F 11/076; G06F 11/1072
See application file for complete search history.

(56) References Cited

U.S. PATENT DOCUMENTS

| 7,876,620 B2 * | 1/2011 | Mokhlesi ........... G11C 16/3427 365/185.21 |
| 8,472,274 B2 * | 6/2013 | Fai ........................... G11C 7/04 365/211 |
| 9,053,808 B2 | 6/2015 | Sprouse et al. |
| 9,165,668 B1 | 10/2015 | Zhao et al. |
| 9,280,419 B2 | 3/2016 | Chunn et al. |
| 9,361,029 B2 | 6/2016 | Strasser et al. |
| 9,361,030 B2 | 6/2016 | Tuers et al. |
| 9,520,200 B2 | 12/2016 | Nurminen et al. |
| 9,552,171 B2 | 1/2017 | Huang |
| 9,646,709 B2 | 5/2017 | Reusswig et al. |
| 10,021,777 B2 | 7/2018 | Stoev et al. |
| 10,114,584 B2 | 10/2018 | Gorobets et al. |

(Continued)

*Primary Examiner* — Amine Riad
(74) *Attorney, Agent, or Firm* — Patterson + Sheridan, LLP; Steven H. Versteeg

(57) ABSTRACT

A method and apparatus for dynamically determining when, or how often, to do a read scan operation on a solid-state storage drive. One solution adjusts a read scan interval as part of performing a read scan operation. First, a bit error rate is determined for one of a plurality of storage blocks of a non-volatile memory array. Then, a cross temperature metric for the storage block is determined. A read scan interval is changed in response to the cross temperature metric satisfying a cross temperature threshold. Then, data in the storage block is relocated to a free storage block in response to the bit error rate satisfying a relocation threshold.

19 Claims, 13 Drawing Sheets

(56) References Cited

U.S. PATENT DOCUMENTS

| | | | |
|---|---|---|---|
| 10,224,111 B2 | 3/2019 | Li et al. | |
| 10,283,205 B2 | 5/2019 | Malshe et al. | |
| 2003/0028746 A1* | 2/2003 | Durrant | G06F 12/1027 |
| | | | 711/206 |
| 2009/0282186 A1 | 11/2009 | Mokhlesi et al. | |
| 2011/0047322 A1 | 2/2011 | Allen et al. | |
| 2016/0322113 A1 | 11/2016 | Parker | |
| 2017/0117053 A1 | 4/2017 | Sharon et al. | |
| 2017/0185535 A1* | 6/2017 | Stark | G06F 11/0751 |
| 2018/0197619 A1* | 7/2018 | Chen | G11C 11/5628 |
| 2018/0341415 A1* | 11/2018 | Koudele | G06F 3/061 |
| 2018/0341553 A1* | 11/2018 | Koudele | G11C 16/26 |
| 2018/0350446 A1* | 12/2018 | K | G11C 29/38 |
| 2020/0019459 A1* | 1/2020 | Cadloni | G06F 11/142 |
| 2020/0110671 A1* | 4/2020 | Woo | G06F 11/1456 |
| 2021/0011631 A1* | 1/2021 | Danjean | G11C 29/028 |
| 2021/0012856 A1* | 1/2021 | Xie | G11C 29/028 |
| 2021/0089453 A1* | 3/2021 | Hayakawa | G06F 11/1641 |
| 2021/0132867 A1* | 5/2021 | Lang | G11C 7/22 |
| 2021/0182166 A1* | 6/2021 | Hahn | G06F 11/3086 |

\* cited by examiner

| STORAGE BLOCK ID 1002 | CONFIGURATION PARAMETERS 1014 | | |
|---|---|---|---|
| | READ LEVEL R1 1004 | READ LEVEL R2 1006 | READ LEVEL R3 1008 |
| SB0 | 01h | 01h | 02h |
| SB1 | 02h | 02h | 04h |
| SB2 | FEh | FEh | FCh |
| SB3 | 02h | 01h | 02h |
| SB4 | FDh | FDh | FAh |
| ⋮ | ⋮ | ⋮ | ⋮ |
| SBn | 04h | 03h | 05h |

PREDETERMINED NUMBER OF DIFFERENT READ LEVELS 1010

FIG. 10

VARIABLE READ SCAN FOR SOLID-STATE STORAGE DEVICE QUALITY OF SERVICE

BACKGROUND

Solid-state storage drives (SSDs) use periodic data integrity checks to determine whether or not to perform a data scrub operation or a data refresh operation on data at locations at risk of deterioration within the drive. This data integrity check is referred to herein as a read scan operation. Such risk locations may develop based on an increased numbers of program/erase (PE) cycles, a length of time since the data was written, cross temperature effects, and the like.

Read scan, read scrub, and/or data refresh operations are expensive operations in terms of storage device bandwidth and latency. Implementing a read scan operation may interrupt a host interacting with the SSD, uses additional PE cycles leading to write amplification, and takes time to read through all of the logical erase blocks (LEBs) (also referred to as metablocks or super blocks) used on the storage device.

Implementation of SSDs in markets such as server applications, where quality of service (QoS) is critical, increasingly requires an intelligent balance of SSD read scan operations with quality and speed of service. There is, therefore, a need to implement SSD read scan operations in a more effective manner than conventional periodic schemes.

BRIEF SUMMARY

This disclosure relates to a method for dynamically implementing read scan operations on an SSD. First, a bit error rate is determined for one of a plurality of storage blocks of a non-volatile memory array. Then, a cross temperature metric for the storage block is determined. A read scan interval may be changed in response to the cross temperature metric satisfying a cross temperature threshold. Finally, data in the storage block is relocated to a free storage block in response to the bit error rate satisfying a relocation threshold. "Read scan interval" refers to a period of time between successive executions of a read scan operation.

This disclosure also relates to an apparatus comprising a read scanner, an error correction code decoder, a health manager, and a data mover. The read scanner is configured to read data from one of a plurality of storage blocks of a non-volatile memory array. The non-volatile memory array comprises a plurality of memory die. Each memory die includes a temperature sensor. The error correction code decoder is configured to determine a bit error rate for the data read by the read scanner. The health manager is configured to determine that the storage block spans a hottest memory die of the plurality of memory die based on a die temperature reported by each temperature sensor. The data mover is configured to move data from the storage block to a free storage block in response to the bit error rate satisfying a read bit error rate threshold. The read scanner is configured to reduce a read scan interval for a read scan operation in response to determining that the storage block spans the hottest memory die.

Finally, this disclosure relates to an apparatus comprising a plurality of storage blocks and a storage controller. The storage controller is configured to determine a storage block of the plurality of storage blocks having a bit error rate above a read bit error rate threshold. The storage controller then iteratively attempts to read data from the storage block using a predetermined number of different read levels. In response to successfully reading data of the storage block via the iterative attempts, the storage controller changes one or more read levels of the storage block to one or more of the predetermined number of different read levels used to successfully read the data of the storage block. Finally, the storage controller increases a read scan frequency of the plurality of storage blocks in response to changing the one or more read levels.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIG. 10 illustrates a table of configuration parameters 1000 for use with one embodiment.

DETAILED DESCRIPTION

Figure 1:
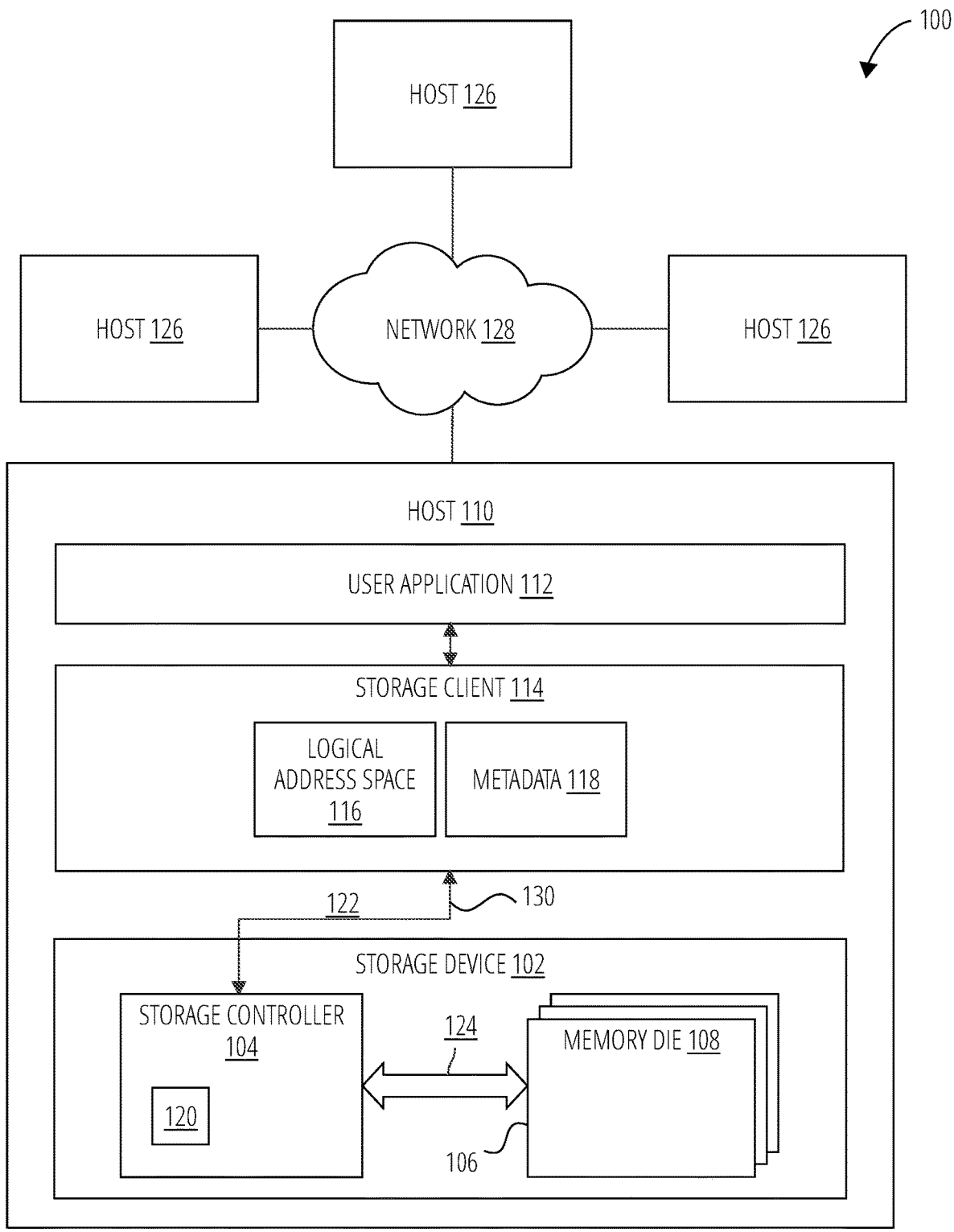
FIG. 1 is a block diagram of a storage system 100 in accordance with one embodiment.

Bit error rate may increase when an SSD has experienced an extended period of time since the data was written or a high number of PE cycles. Cross temperature effects may also contribute to a higher bit error rate. For this reason, a dynamically implemented read scan solution may adjust the frequency of the read scan or interval for launching the read scan or whether or not to launch a read scan operation immediately. Read scan frequency may be adjusted based on a detected cross temperature conditions, based on a temperature scan indicating a rise in temperature for a particular logical erase block, metablock, or die within a metablock, and/or based on a cell threshold voltage distribution (CVD) scan that detects a need to change read levels because the bit error rate is too high at current read levels.

"Read scan operation" refers to a maintenance operation performed to identify and mitigate or avoid or counter errors in the data or storage cells and/or other components of a non-volatile storage device. A read scan operation may be referred to, interchangeably, as a "read scan" or "read scan operation."

In one embodiment, a read scan operation involves reading data from, or sensing a determinable physical characteristic, or a memory state of storage cells in a storage block. Next, the read scan operation checks the memory states of the storage cells for any errors, corrects as many errors as possible, and determines a bit error rate. Then, the read scan operation determines if the bit error rate satisfies a threshold such as a read bit error rate threshold.

In one embodiment, the read scan operation reads data from each logical page, or word line, of the storage block. In another embodiment, the read scan operation selects less than all of the logical pages of the storage block. In other words, the read scan operation may sample the logical pages of the storage block from which to read data for the read scan operation.

If a read bit error rate threshold is satisfied, the read scan operation then may perform a data scrub operation or a data refresh operation. In certain embodiments, a read scan operation may always include a data scrub operation or a data refresh operation. In other embodiments, performing a data scrub operation or data refresh operation may be conditioned on the bit error rate satisfying a read bit error rate threshold. In such embodiments, a read scan operation may be referred to as a "read scrub" or "read scrub operation." In these embodiments, a read scan operation may conditionally include a data scrub operation.

In certain embodiments, a read scan operation may operate as a foreground process meaning that the read scan operation interrupts, or delays, a non-volatile storage device from servicing read commands or write commands for a host. In addition, the read scan operation may need to complete working on a particular storage block and thereby delay a host read command for data on that particular storage block. Thus, a read scan operation may impact quality of service levels between a host and the non-volatile storage device.

"PE cycle" refers to a count of the number of times a set of memory cells is programmed and erased. The set of memory cells may include any collection of memory cell including a data block, a word line, a page, a logical page, an erase block, a logical erase block, a memory array, a memory die, or the like. PE cycles (PEC) may be designated in units of thousands, such as 4 k, 50 k, and the like.

A non-volatile storage device, such as solid-state memory, may have a lower data retention capability at higher temperatures, and such lower ability may be further worsened when the memory is worn. The non-volatile storage device may be configured to provide a certain level of error correction capability. If errors exceed this level, data with these errors may become unreadable. Data stored on non-volatile memory media at temperatures within one range, however, may exhibit less sensitivity to data retention issues, even if the memory has experienced wear.

Cross temperature is a common phenomenon in non-volatile memory media, such as NAND flash memories and is related to temperature differences between storage operations. "Cross temperature" refers to a condition in which a die temperature of a memory cell at a time when the memory cell is read/sensed is different from a die temperature of the same memory cell when the memory cell was written to (programmed). In certain embodiments, a cross temperature may be represented by a value referred to as a cross temperature metric. In certain types of non-volatile memory media, such as NAND memory cells when the difference between die temperature when the memory cell is written and when the memory cell is read is sufficiently high, the data of the memory cell may become unreadable (a read command results in an error). Currently, non-volatile storage devices have countermeasures such that data stored in a non-volatile memory subject to a cross temperature condition can be read, however the non-volatile storage device should detect a cross temperature condition such that these countermeasures may be employed.

This cross temperature phenomenon is known to produce both shifting of the cell threshold voltage distributions (CVDs), as well as widening of the CVDs. The shifting phenomena may be related to varying sensitivity of the different NAND cells to the cross temperature. When CVDs have shifted far enough, they may impact bit error rates, and thus may contribute to conditions requiring data scrub operations.

FIG. 1 is a schematic block diagram illustrating one embodiment of a storage system 100 in accordance with the disclosed solution. The storage system 100 comprises a storage device 102, a storage controller 104, a memory die 108, a host 110, a user application 112, a storage client 114, a logical address space 116, a metadata 118, a flash translation layer 120, a data bus 122, a bus 124, at least one host 126, and a network 128.

"Storage client" refers to any hardware, software, firmware, or logic component or module configured to communicate with a storage device in order to use storage services. Examples of a storage client include, but are not limited to, operating systems, file systems, database applications, a database management system ("DBMS"), server applications, a server, a volume manager, kernel-level processes, user-level processes, applications, mobile applications, threads, processes, and the like. "Hardware" refers to functional elements embodied as analog and/or digital circuitry. "Firmware" refers to logic embodied as processor-executable instructions stored on volatile memory media and/or non-volatile memory media. "Software" refers to logic implemented as processor-executable instructions in a machine memory (e.g. read/write volatile memory media or non-volatile memory media). "Logic" refers to machine memory circuits, non-transitory machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

"Data block" refers to a smallest physical amount of storage space on physical storage media that is accessible, and/or addressable, using a storage command. The physical storage media may be volatile memory media, non-volatile memory media, persistent storage, non-volatile storage, flash storage media, hard disk drive, or the like. Certain conventional storage devices divide the physical storage media into volumes or logical partitions (also referred to as partitions). Each volume or logical partition may include a plurality of sectors. One or more sectors are organized into a block (also referred to as a data block). In certain storage systems, such as those interfacing with the Windows® operating systems, the data blocks are referred to as clusters. In other storage systems, such as those interfacing with UNIX, Linux, or similar operating systems, the data blocks are referred to simply as blocks. A data block or cluster represents a smallest physical amount of storage space on the storage media that is managed by a storage controller. A block storage device may associate n data blocks available for user data storage across the physical storage media with a logical block address (LBA), numbered from 0 to n. In certain block storage devices, the logical block addresses may range from 0 to n per volume or logical partition. In conventional block storage devices, a logical block address maps directly to one and only one data block.

"Storage operation" refers to an operation performed on a memory cell in order to change, or obtain, the value of data represented by a state characteristic of the memory cell. Examples of storage operations include but are not limited to reading data from (or sensing a state of) a memory cell, writing (or programming) data to a memory cell, and/or erasing data stored in a memory cell.

"Storage command" refers to any command relating with a storage operation. Examples of storage commands include, but are not limited to, read commands, write commands, maintenance commands, diagnostic commands, test mode commands, countermeasure command, and any other command a storage controller may receive from a host or issue to another component, device, or system. "Countermeasure command" refers to a storage command configured to implement a countermeasure to mitigate, or reverse, deterioration of a storage block and/or deteriorating storage block health.

"Volatile memory media" refers to any hardware, device, component, element, or circuit configured to maintain an alterable physical characteristic used to represent a binary value of zero or one for which the alterable physical characteristic reverts to a default state that no longer represents the binary value when a primary power source is removed or unless a primary power source is used to refresh the represented binary value. Examples of volatile memory media include but are not limited to dynamic random-access memory (DRAM), static random-access memory (SRAM), double data rate random-access memory (DDR RAM) or other random-access solid-state memory.

While the volatile memory media is referred to herein as "memory media," in various embodiments, the volatile memory media may more generally be referred to as volatile memory.

In certain embodiments, data stored in volatile memory media is addressable at a byte level which means that the data in the volatile memory media is organized into bytes (8 bits) of data that each have a unique address, such as a logical address.

"Memory" refers to any hardware, circuit, component, module, logic, device, or apparatus configured, programmed, designed, arranged, or engineered to retain data. Certain types of memory require availability of a constant power source to store and retain the data. Other types of memory retain and/or store the data when a power source is unavailable.

"Uncorrectable bit error rate" refers to a measure of a rate indicating a number of bits that are that are uncorrectable and in error for a given number of bits that are processed. Bits that are uncorrectable are deemed uncorrectable after one or more error correction techniques are attempted such as use of Error Correction Codes (ECC), use of Bose, Chaudhuri, Hocquenghem (BCH) codes, use of a Low Density Parity Check (LDPC) algorithm, and the like.

"Fail bit count" refers to a measure of a number of bits that are in error for a given unit of measure. Bits that are in error are bits that were stored with one value but then when the same bits where read or sensed the bit indicated a different value. Fail bit counts may be measured for a data block (e.g., 4K), an erase block, a page, a logical erase block, a zone, a namespace, or the like. Said another way, the failed bit count may be a number of bits that differ between data written to a data block, physical erase block, or other grouping of memory cells and data subsequently read from data block, physical erase block, or other grouping of memory cells.

The storage system 100 includes at least one storage device 102, comprising a storage controller 104 and one or more memory die 108, connected by a bus 124. In some embodiments, the storage system 100 may include two or more memory devices. "Storage device" refers to any hardware, system, sub-system, circuit, component, module, non-volatile memory media, hard disk drive, storage array, device, or apparatus configured, programmed, designed, or engineered to store data for a period of time and retain the data in the storage device while the storage device is not using power from a power supply. Examples of storage devices include, but are not limited to, a hard disk drive, FLASH memory, MRAM memory, a Solid-State storage device, Just a Bunch Of Disks (JBOD), Just a Bunch Of Flash (JBOF), an external hard disk, an internal hard disk, and the like.

"Memory die" refers to a small piece of semiconducting material on which a given functional circuit is fabricated. Typically, integrated circuits are produced in large batches on a single wafer of electronic-grade silicon (EGS) or other semiconductor (such as GaAs) through processes such as photolithography. The wafer is cut (diced) into many pieces, each containing one copy of the circuit. Each of these pieces is called a die or memory die. (Search "die (integrated circuit)" on Wikipedia.com Oct. 9, 2019. Accessed Nov. 18, 2019.)

A memory die is a die, in one embodiment, that includes one or more functional circuits for operating as a non-volatile memory media and/or a non-volatile memory array. "Non-volatile memory media" refers to any hardware, device, component, element, or circuit configured to maintain an alterable physical characteristic used to represent a binary value of zero or one after a primary power source is removed. Examples of the alterable physical characteristic include, but are not limited to, a threshold voltage for a transistor, an electrical resistance level of a memory cell, a current level through a memory cell, a magnetic pole orientation, a spin-transfer torque, and the like.

The alterable physical characteristic is such that, once set, the physical characteristic stays sufficiently fixed such that when a primary power source for the non-volatile memory media is unavailable the alterable physical characteristic can be measured, detected, or sensed, when the binary value is read, retrieved, or sensed. Said another way, non-volatile memory media is a storage media configured such that data stored on the non-volatile memory media is retrievable after a power source for the non-volatile memory media is removed and then restored. Non-volatile memory media may comprise one or more non-volatile memory elements, which may include, but are not limited to: chips, packages, planes, memory die, and the like.

Examples of non-volatile memory media include but are not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random-access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like.

While the non-volatile memory media is referred to herein as "memory media," in various embodiments, the non-volatile memory media may more generally be referred to as non-volatile memory. Because non-volatile memory media is capable of storing data when a power supply is removed, the non-volatile memory media may also be referred to as a recording media, non-volatile recording media, non-volatile storage media, storage, non-volatile memory, volatile memory medium, non-volatile storage medium, non-volatile storage, or the like.

In certain embodiments, data stored in non-volatile memory media is addressable at a block level which means that the data in the non-volatile memory media is organized into data blocks that each have a unique logical address (e.g., LBA). In other embodiments, data stored in non-volatile memory media is addressable at a byte level which means that the data in the non-volatile memory media is organized into bytes (8 bits) of data that each have a unique address, such as a logical address. One example of byte addressable non-volatile memory media is storage class memory (SCM).

"Non-volatile memory" refers to shorthand name for non-volatile memory media. In certain embodiments, non-volatile memory media refers to the non-volatile memory media and the logic, controllers, processor(s), state machine(s), and/or other periphery circuits that manage the non-volatile memory media and provide access to the non-volatile memory media. "Non-volatile memory array" refers to a set of non-volatile storage cells (also referred to as memory cells or non-volatile memory cells) organized into an array structure having rows and columns. A memory array is addressable using a row identifier and a column identifier.

"Memory cell" refers to a type of storage media configured to represent one or more binary values by way of a determinable physical characteristic of the storage media when the storage media is sensed, read, or detected to determine what binary value(s) was last stored in the memory cell. Memory cell and storage cell are used interchangeably herein.

"Storage cell" refers to a type of storage media configured to represent one or more binary values by way of a determinable characteristic of the storage media when the storage media is sensed, read, or detected to determine a binary value(s) stored, or represented by, the determinable characteristic of the memory cell. Storage cell and memory cell are used interchangeably herein.

The type of determinable characteristic used to store data in a memory cell may vary depending on the type of memory or storage technology used. For example, in flash memory cells in which each memory cell comprises a transistor having a source lead, a drain lead and a gate, the determinable characteristic is a voltage level that when applied to the gate causes the memory cell to conduct a current between the drain and the source leads. The voltage level, in this example, is referred to herein as a threshold voltage. A threshold voltage may also be referred to as a control gate reference voltage (CGRV), read voltage, or reference voltage.

Examples of the determinable physical characteristic include, but are not limited to, a threshold voltage for a transistor, an electrical resistance level of a memory cell, a current level through a memory cell, a magnetic pole orientation, a spin-transfer torque, and the like.

Each storage device 102 may include two or more memory die 108, such as flash memory, nano random-access memory ("nano RAM or NRAM"), magneto-resistive RAM ("MRAM"), dynamic RAM ("DRAM"), phase change RAM ("PRAM"), etc. In further embodiments, the data storage device 102 may include other types of non-volatile and/or volatile data storage, such as dynamic RAM ("DRAM"), static RAM ("SRAM"), magnetic data storage, optical data storage, and/or other data storage technologies. The memory die 108 may be configured into a non-volatile memory array 106. "Memory array" refers to a set of storage cells (also referred to as memory cells) organized into an array structure having rows and columns. A memory array is addressable using a row identifier and a column identifier.

Consequently, a non-volatile memory array is a memory array having memory cells configured such that a characteristic (e.g., threshold voltage level, resistance level, conductivity, etc.) of the memory cell used to represent stored data remains a property of the memory cell without a requirement for using a power source to maintain the characteristic.

A memory array is addressable using a row identifier and a column identifier. Those of skill in the art recognize that a memory array may comprise the set of memory cells within a plane, the set of memory cells within a memory die, the set of memory cells within a set of planes, the set of memory cells within a set of memory die, the set of memory cells within a memory package, the set of memory cells within a set of memory packages, or with other known memory cell set architectures and configurations.

A memory array may include a set of memory cells at a number of levels of organization within a storage or memory system. In one embodiment, memory cells within a plane may be organized into a memory array. In one embodiment, memory cells within a plurality of planes of a memory die may be organized into a memory array. In one embodiment, memory cells within a plurality of memory dies of a memory device may be organized into a memory array. In one embodiment, memory cells within a plurality of memory devices of a storage system may be organized into a memory array.

The storage device 102, also referred to herein as a storage device, may be a component within a host 110 as depicted in here, and may be connected using a data bus 122, such as a peripheral component interconnect express ("PCIe") bus, a Serial Advanced Technology Attachment ("serial ATA") bus, or the like. In another embodiment, the storage device 102 is external to the host 110 and is connected, a universal serial bus ("USB") connection, an Institute of Electrical and Electronics Engineers ("IEEE") 1394 bus ("FireWire"), or the like. In other embodiments, the storage device 102 is connected to the host 110 using a peripheral component interconnect ("PCI") express bus using external electrical or optical bus extension or bus networking solution such as InfiniB and or PCI Express Advanced Switching ("PCIe-AS"), or the like.

In various embodiments, the storage device 102 may be in the form of a dual-inline memory module ("DIMM"), a daughter card, or a micro-module. In another embodiment, the storage device 102 is a component within a rack-mounted blade. In another embodiment, the storage device 102 is contained within a package that is integrated directly onto a higher-level assembly (e.g., mother board, laptop, graphics processor). In another embodiment, individual components comprising the storage device 102 are integrated directly onto a higher-level assembly without intermediate packaging.

In a further embodiment, instead of being connected directly to the host 110 as DAS, the data storage device 102 may be connected to the host 110 over a data network. For example, the data storage device 102 may include a storage area network ("SAN") storage device, a network attached storage ("NAS") device, a network share, or the like. In one embodiment, the storage system 100 may include a data network, such as the Internet, a wide area network ("WAN"), a metropolitan area network ("MAN"), a local area network ("LAN"), a token ring, a wireless network, a fiber channel network, a SAN, a NAS, ESCON, or the like, or any combination of networks. A data network may also include a network from the IEEE 802 family of network technologies, such Ethernet, token ring, Wi-Fi, Wi-Max, and the like. A data network may include servers, switches, routers, cabling, radios, and other equipment used to facilitate networking between the host 110 and the data storage device 102.

The storage system 100 includes at least one host 110 connected to the storage device 102. "Host" refers to any computing device or computer device or computer system configured to send and receive storage commands. Examples of a host include, but are not limited to, a computer, a laptop, a mobile device, an appliance, a virtual machine, an enterprise server, a desktop, a tablet, a main frame, and the like.

Multiple hosts 110 may be used and may comprise a server, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. In another embodiment, a host 110 may be a client and the storage device 102 operates autonomously to service data requests sent from the host 110. In this embodiment, the host 110 and storage device 102 may be connected using a computer network, system bus, Direct Attached Storage (DAS) or other communication means suitable for connection between a computer and an autonomous storage device 102.

The depicted embodiment shows a user application 112 in communication with a storage client 114 as part of the host 110. In one embodiment, the user application 112 is a software application operating on or in conjunction with the storage client 114.

The storage client 114 manages files and data and utilizes the functions and features of the storage controller 104 and associated memory die 108. Representative examples of storage clients include, but are not limited to, a server, a file system, an operating system, a database management system ("DBMS"), a volume manager, and the like. The storage client 114 is in communication with the storage controller 104 within the storage device 102. In some embodiments, the storage client 114 may include remote storage clients operating on hosts 126 or otherwise accessible via the network 128. Storage clients may include, but are not limited to operating systems, file systems, database applications, server applications, kernel-level processes, user-level processes, applications, and the like.

The storage client 114 may present a logical address space 116 to the host 110 and/or user application 112. The logical address space 116 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

"Logical address space" refers to a logical representation of memory resources. The logical address space may comprise a plurality (e.g., range) of logical addresses. "Logical address" refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like. A logical address does not indicate the physical location of data on the storage media but is an abstract reference to the data. "Logical block address" refers to a value used in a block storage device to associate each of n logical blocks available for user data storage across the storage media with an address. In certain block storage devices, the logical block addresses (LBAs) may range from 0 to n per volume or partition. In block storage devices, each LBA maps directly to a particular data block, and each data block maps to a particular set of physical sectors on the physical storage media.

In one embodiment, a device driver for the host 110 (and/or the storage client 114) may maintain metadata 118 within the storage client 114, such as a logical to physical address mapping structure, to map logical addresses of the logical address space 116 to storage locations on the memory die 108. In another embodiment, such metadata 118 may be stored and maintained by a storage controller 104. A device driver may be configured to provide storage services to one or more storage clients.

The storage client 114 may comprise the flash translation layer 120. "Flash translation layer" refers to logic in a FLASH memory device that includes logical-to-physical address translation providing abstraction of the logical block addresses used by the storage client and the physical block addresses at which the storage controller stores data. The logical-to-physical translation layer maps logical block addresses (LBAs) to physical addresses of data stored on solid-state storage media. This mapping allows data to be referenced in a logical block address space using logical identifiers, such as a block address. A logical identifier does not indicate the physical location of data on the solid-state storage media but is an abstract reference to the data.

The flash translation layer 120 receives the processed data as well as one or more control signals to determine the flash translation layer queue depth. The flash translation layer 120 may determine an appropriate physical address to send data and commands to the memory die 108 and the volatile memory. In certain embodiments, a storage client 114 may include the flash translation layer 120 and may manage metadata 118 associated with the flash translation layer 120. In one embodiment, the flash translation layer 120 also receives the data outputs from the memory die 108.

In one embodiment, the storage system 100 includes one or more clients connected to one or more hosts 126 through one or more computer networks 128. A host 126 may be a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. The network 128 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The network 128 may also include a network from the IEEE 802 family of network technologies, such Ethernet, token ring, WiFi, WiMax, and the like.

The network 128 may include servers, switches, routers, cabling, radios, and other equipment used to facilitate networking the host 110 or hosts and host 126 or clients. In one embodiment, the storage system 100 includes multiple hosts that communicate as peers over a network 128. In another embodiment, the storage system 100 includes multiple memory devices that communicate as peers over a network 128. One of skill in the art will recognize other computer networks comprising one or more computer networks and related equipment with single or redundant connection between one or more clients or other computer with one or more memory devices or one or more memory devices connected to one or more hosts. In one embodiment, the storage system 100 includes two or more memory devices connected through the network 128 to a host 126 without a host 110.

In one embodiment, the storage client 114 communicates with the storage controller 104 through a host interface comprising an Input/Output (I/O) interface. For example, the storage device 102 may support the ATA interface standard, the ATA Packet Interface ("ATAPI") standard, the small computer system interface ("SCSI") standard, and/or the Fibre Channel standard which are maintained by the InterNational Committee for Information Technology Standards ("INCITS").

In certain embodiments, the storage media of a memory device is divided into volumes or partitions. Each volume or partition may include a plurality of sectors. Traditionally, a sector is 512 bytes of data. One or more sectors are organized into a block (referred to herein as both block and data block, interchangeably).

In one example embodiment, a data block includes eight sectors which is 4 KB. In certain storage systems, such as those interfacing with the Windows® operating systems, the data blocks are referred to as clusters. In other storage systems, such as those interfacing with UNIX, Linux, or similar operating systems, the data blocks are referred to simply as blocks. A block or data block or cluster represents a smallest physical amount of storage space on the storage media that is managed by a storage manager, such as a storage controller, storage system, storage unit, storage device, or the like.

In some embodiments, the storage controller 104 may be configured to store data on one or more asymmetric, write once storage media, such as solid-state storage memory cells within the memory die 108.

"Write once storage media" refers to a storage media such as a storage cell that must be reinitialized (e.g., erased) before new data or a change to the data is written or programmed thereon. In other words, data of a write once storage media cannot be overwritten, the write once storage media must be erased before subsequently writing data to the write once storage media. Read scan operations may not be interruptible or may not be easily interrupted.

As used herein, an "asymmetric" storage media refers to a storage media having different latencies for different storage operations. Many types of solid-state storage media (e.g., memory die) are asymmetric; for example, a read operation may be much faster than a write/program operation, and a write/program operation may be much faster than an erase operation (e.g., reading the storage media may be hundreds of times faster than erasing, and tens of times faster than programming the storage media). The memory die 108 may be partitioned into memory divisions that can be erased as a group (e.g., erase blocks) in order to, inter alia, account for the asymmetric properties of the memory die 108 or the like.

As such, modifying a single data segment in-place may include erasing the entire erase block comprising the data, and rewriting the modified data to the erase block, along with the original, unchanged data. This may result in inefficient write amplification, which may excessively wear the memory die 108. "Write amplification" refers to a measure of write programming operations performed on a non-volatile storage device which result in writing any data, and user data in particular, more times than initially writing the data in a first instance. In certain embodiments, write amplification may count the number of write operations performed by a non-volatile storage device in order to manage and maintain the data stored on the non-volatile storage device. In other embodiments, write amplification measures the amount of data, the number of bits, written that are written beyond an initial storing of data on the non-volatile storage device.

Therefore, in some embodiments, the storage controller 104 may be configured to write data out-of-place. As used herein, writing data "out-of-place" refers to writing data to different media storage location(s) rather than overwriting the data "in-place" (e.g., overwriting the original physical location of the data). Modifying data out-of-place may avoid write amplification, since existing, valid data on the erase block with the data to be modified need not be erased and recopied. Moreover, writing data out-of-place may remove erasure from the latency path of many storage operations (e.g., the erasure latency is no longer part of the main path of a write operation).

Management of a data block by a storage manager includes specifically addressing a particular data block for a read operation, write operation, or maintenance operation. A block storage device may associate n blocks available for user data storage across the storage media with a logical address, numbered from 0 to n. In certain block storage devices, the logical addresses may range from 0 to n per volume or partition.

In conventional block storage devices, a logical address maps directly to a particular data block on physical storage media. In conventional block storage devices, each data block maps to a particular set of physical sectors on the physical storage media. However, certain storage devices do not directly or necessarily associate logical addresses with particular physical data blocks. These storage devices may emulate a conventional block storage interface to maintain compatibility with a block storage client 114.

In one embodiment, the storage controller 104 provides a block I/O emulation layer, which serves as a block device interface, or API. In this embodiment, the storage client 114 communicates with the storage device through this block device interface. In one embodiment, the block I/O emulation layer receives commands and logical addresses from the storage client 114 in accordance with this block device interface. As a result, the block I/O emulation layer provides the storage device compatibility with a block storage client 114.

In one embodiment, a storage client 114 communicates with the storage controller 104 through a host interface comprising a direct interface. In this embodiment, the storage device directly exchanges information specific to nonvolatile storage devices. "Non-volatile storage device" refers to any hardware, device, component, element, or circuit configured to maintain an alterable physical characteristic used to represent a binary value of zero or one after a primary power source is removed. Examples of a non-volatile storage device include, but are not limited to, a hard disk drive (HDD), Solid-State Drive (SSD), non-volatile memory media, and the like.

A storage device using direct interface may store data in the memory die 108 using a variety of organizational constructs including, but not limited to, blocks, sectors, pages, logical blocks, logical pages, erase blocks, logical erase blocks, ECC codewords, logical ECC codewords, or in any other format or structure advantageous to the technical characteristics of the memory die 108.

The storage controller 104 receives a logical address and a command from the storage client 114 and performs the corresponding operation in relation to the memory die 108. The storage controller 104 may support block I/O emulation, a direct interface, or both. "Storage controller" refers to any hardware, device, component, element, or circuit configured to manage data operations on non-volatile memory media, and may comprise one or more processors, programmable processors (e.g., FPGAs), ASICs, micro-controllers, or the like. In some embodiments, the storage controller is configured to store data on and/or read data from non-volatile memory media, to transfer data to/from the non-volatile memory device(s), and so on.

Figure 2:
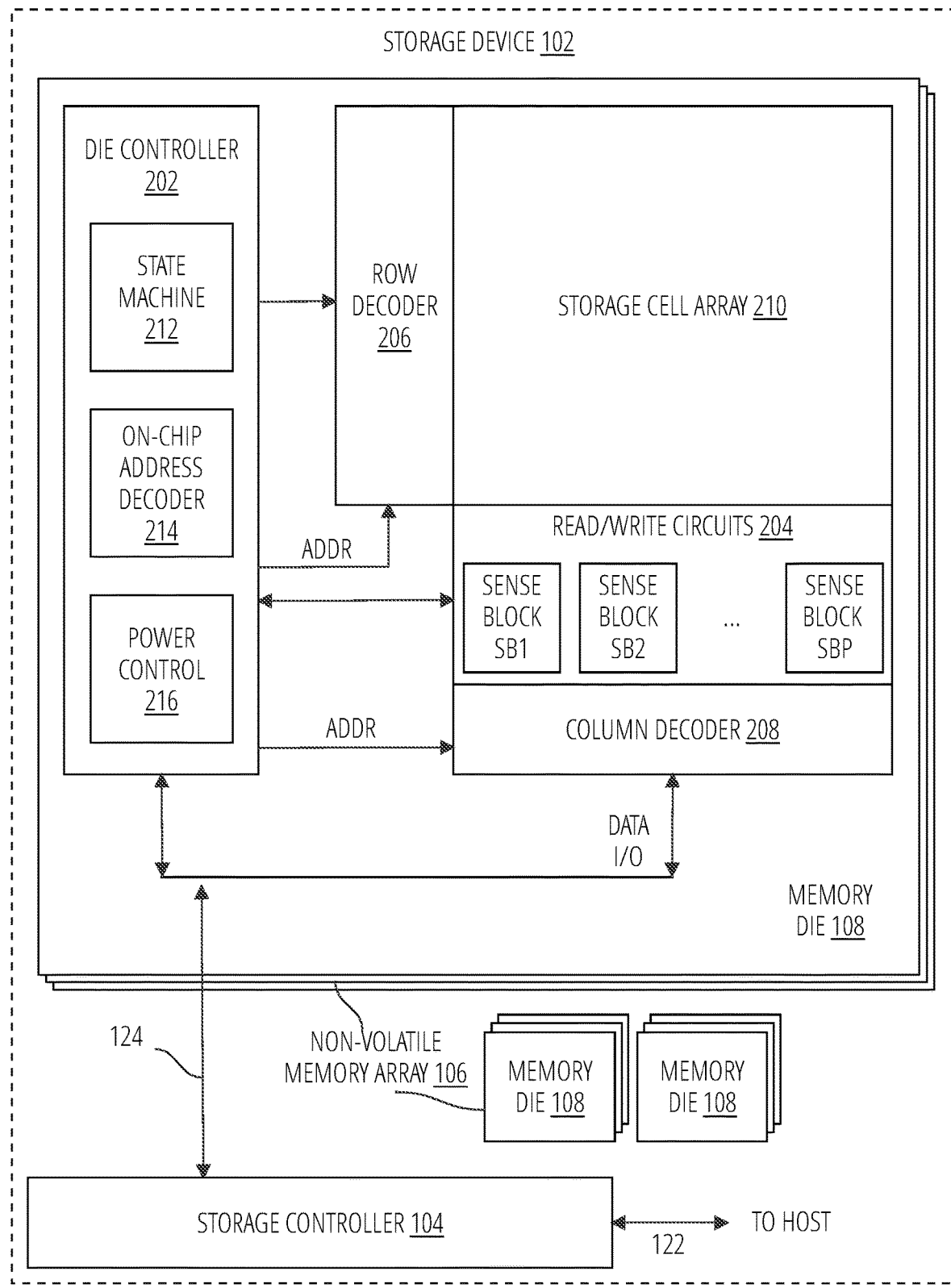
FIG. 2 is a block diagram of a storage device 102 in one embodiment.

FIG. 2 is a block diagram of a storage device 102. The storage device 102 may include a storage controller 104 and a non-volatile memory array 106. Each memory die 108 in the non-volatile memory array 106 may include a die controller 202 and at least one storage cell array 210 in the form of a three-dimensional array, and read/write circuits 204.

The storage cell array 210 is addressable by word line, which corresponds to a row, via a row decoder 206 and by bit line via a column decoder 208. "Word line" refers to a structure within a memory array comprising a set of memory cells. The memory array is configured such that the operational memory cells of the word line are read or sensed during a read operation. Similarly, the memory array is configured such that the operational memory cells of the word line are read, or sensed, during a read operation. The read/write circuits 204 include multiple sense blocks SB1, SB2, . . . , SBp (sensing circuitry) and allow a page of memory cells to be read or programmed in parallel. In certain embodiments, each memory cell across a row of the memory array together form a physical page.

A physical page may include memory cells along a row of the memory array for a single plane or for a single memory die. In one embodiment, the memory die includes a memory array made up of two equal sized planes. In one embodiment, a physical page of one plane of a memory die includes four data blocks (e.g., 16 KB). In one embodiment, a physical page (also called a "die page") of a memory die includes two planes each having four data blocks (e.g., 32 KB).

Commands and data, such as those to enact storage operation 130, are transferred between the host 110 and storage controller 104 via a data bus 122, and between the storage controller 104 and the one or more memory die 108 via bus 124.

The storage cell array 210 can be two-dimensional (2D—laid out in a single fabrication plane) or three-dimensional (3D—laid out in multiple fabrication planes). The storage cell array 210 may comprise one or more arrays of memory cells including a 3D array. In one embodiment, the storage cell array 210 may comprise a monolithic three-dimensional memory structure (3D array) in which multiple memory levels are formed above (and not in) a single substrate, such as a wafer, with no intervening substrates. The storage cell array 210 may comprise any type of non-volatile memory that is monolithically formed in one or more physical levels of arrays of memory cells having an active area disposed above a silicon substrate. The storage cell array 210 may be in a non-volatile solid-state drive having circuitry associated with the operation of the memory cells, whether the associated circuitry is above or within the substrate.

"Circuitry" refers to electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes or devices described herein, or a microprocessor configured by a computer program which at least partially carries out processes or devices described herein), circuitry forming a memory device (e.g., forms of random-access memory), or circuitry forming a communications device (e.g., a modem, communications switch, or optical-electrical equipment).

Word lines may comprise sections of the layers containing memory cells, disposed in layers above the substrate. Multiple word lines may be formed on single layer by means of trenches or other non-conductive isolating features.

The die controller 202 cooperates with the read/write circuits 204 to perform memory operations on memory cells of the storage cell array 210, and includes a state machine 212, an address decoder 214, and a power control 216. The state machine 212 provides chip-level control of memory operations.

The address decoder 214 provides an address interface between that used by the host or a storage controller 104 to the hardware address used by the row decoder 206 and column decoder 208. The power control 216 controls the power and voltages supplied to the various control lines during memory operations. The power control 216 and/or read/write circuits 204 can include drivers for word lines, source gate select (SGS) transistors, drain gate select (DGS) transistors, bit lines, substrates (in 2D memory structures), charge pumps, and source lines. In certain embodiments, the power control 216 may detect a sudden loss of power and take precautionary actions. The power control 216 may include various first voltage generators (e.g., the drivers) to generate the voltages described herein. The sense blocks can include bit line drivers and sense amplifiers in one approach.

In some implementations, some of the components can be combined. In various designs, one or more of the components (alone or in combination), other than storage cell array 210, can be thought of as at least one control circuit or storage controller which is configured to perform the techniques described herein. For example, a control circuit may include any one of, or a combination of, die controller 202, state machine 212, address decoder 214, column decoder 208, power control 216, sense blocks SB1, SB2, . . . , SBp, read/write circuits 204, storage controller 104, and so forth.

In one embodiment, the host 110 is a computing device (e.g., laptop, desktop, smartphone, tablet, digital camera) that includes one or more processors, one or more processor readable storage devices (RAM, ROM, flash memory, hard disk drive, solid-state memory) that store processor readable code (e.g., software) for programming the storage controller 104 to perform the methods described herein. The host may also include additional system memory, one or more input/output interfaces and/or one or more input/output devices in communication with the one or more processors, as well as other components well known in the art.

Associated circuitry is typically used for operation of the memory cells and for communication with the memory cells. As non-limiting examples, memory devices may have circuitry used for controlling and driving memory cells to accomplish functions such as programming and reading. This associated circuitry may be on the same substrate as the memory cells and/or on a separate substrate. For example, a storage controller for memory read-write operations may be located on a separate storage controller chip and/or on the same substrate as the memory cells.

One of skill in the art will recognize that the disclosed techniques and devices are not limited to the two-dimensional and three-dimensional exemplary structures described but covers all relevant memory structures within the spirit and scope of the technology as described herein and as understood by one of skill in the art.

Figure 3:
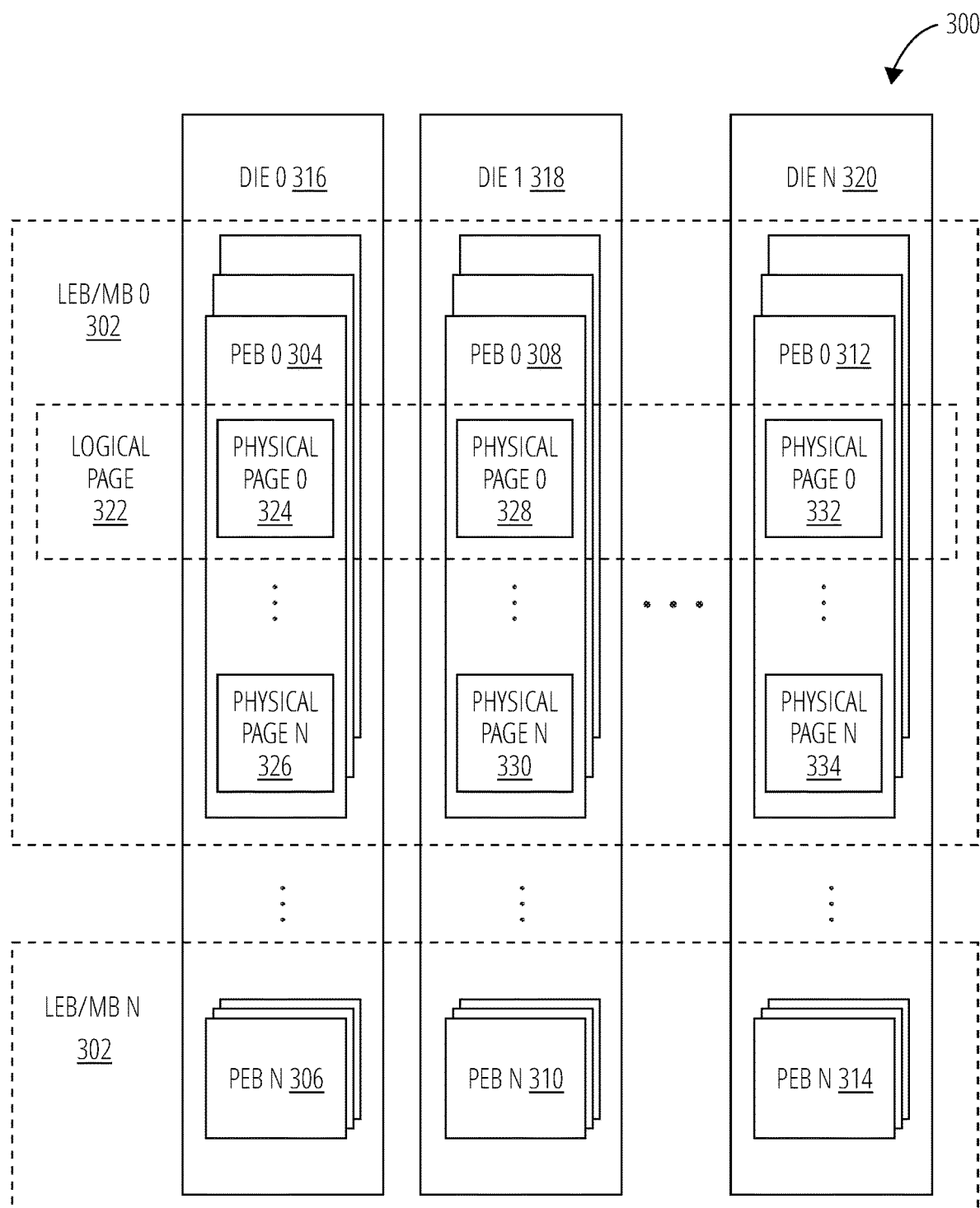
FIG. 3 illustrates a memory array 300 in accordance with one embodiment.

FIG. 3 illustrates a memory array 300 in accordance with one embodiment. In the illustrated embodiment, memory array 300 is organized into logical erase blocks (LEBs), as shown by logical erase block 302 (also referred to herein as a "metablock" or "superblock"). These LEBs include multiple physical erase blocks (PEBs) illustrated by physical erase block 0 304, physical erase block n 306, physical erase block 0 308, physical erase block n 310, physical erase block 0 312, and physical erase block n 314. "Physical erase block" refers to smallest storage unit within a given memory die that can be erased at a given time (e.g., due to the wiring of storage cells on the memory die).

The physical erase blocks may be located in separate storage dies, shown as die 0 316, die 1 318, and die n 320. In certain embodiments, a die is divided into planes. "Plane" refers to a division of a die that permits certain storage operations to be performed on both planes using certain physical row addresses and certain physical column addresses.

Those of skill in the art appreciate the relationship and differences between physical erase blocks and a logical erase blocks and may refer to one, or the other, or both by using the shorthand version erase block, block, or storage block. Those of skill in the art understand from the context of the reference to an erase block whether a physical erase block or a logical erase block (or metablock or superblock) is being referred to. The concepts and techniques used in the art and those recited in the claims can be equally applied to either physical erase blocks or logical erase blocks.

"Erase block" refers to a logical erase block or a physical erase block. In one embodiment, a physical erase block represents the smallest storage unit within a given memory die that can be erased at a given time (e.g., due to the wiring of storage cells on the memory die). In one embodiment, logical erase blocks represent the smallest storage unit, or storage block, erasable by a storage controller in response to receiving an erase command. In such an embodiment, when the storage controller receives an erase command specifying a particular logical erase block, the storage controller may erase each physical erase block within the logical erase block simultaneously. It is noted that physical erase blocks within a given logical erase block may be considered as contiguous within a physical address space even though they reside in separate dies. Thus, the term "contiguous" may be applicable not only to data stored within the same physical medium, but also to data stored within separate media.

"Storage block" refers to a set of storage cells organized such that storage operations can be performed on groups of storage cells in parallel. The organization of the set of storage cells may be implemented at a physical level or a logical level. Thus, a storage block, in one embodiment, may comprise a physical page, such as a word line, a logical page comprising physical pages that span planes and/or memory die, a physical erase block comprising a set of physical pages, a logical erase block (LEB) comprising a set of logical pages, or the like. A storage block may be referred to herein as a "block", a "memory block" or a LEB.

As used herein, a "physical" structure such as a physical page, physical word line, physical erase block, physical plane, physical memory die, or the like, refers to a single physical structure that a controller, manager, module, or other logic component of a system can control and/or communicate with at some level within one or more levels of physical abstraction in the organization of the device, system, or apparatus. Similarly, a "logical" structure such as a logical page, logical word line, logical erase block, logical plane, logical memory die, or the like, refers to a collection of two or more single physical structures of that same type that a controller, manager, module, or other logic component of the system can control and/or communicate with at some level within one or more levels of physical abstraction in the organization of the device, system, or apparatus. It should be noted that one or the other or both a "physical" structure and a "logical" structure may have distinct addresses that can be used to identify one "physical" structure or "logical" structure relative to other structures of a similar nature and type.

"Logical erase block" refers to another term for a storage block. In certain embodiments, a logical erase block refers to a set of logical pages that span planes, memory die, and/or chips. This organization of storage cells is deemed 'logical' because the physical pages may not be directly coupled to each other. However, the physical pages are operated in parallel as though they are a single page. In like manner, multiple physical erase blocks may be operated in parallel as though they are a single erase block and are thus referred to as logical erase blocks. The terms logical erase block, metablock, and super block are used interchangeably herein. "Logical page" refers to a collection of physical page that are treated as a single page for storage operations. "Physical page" refers to physical page represents the smallest storage block within a given memory die that can be written to in a single operation.

A logical erase block such as logical erase block 302 is further divided into multiple logical pages (logical page 322) that, in turn, includes multiple physical pages, such as physical page 0 324, physical page n 326, physical page 0 328, physical page n 330, physical page 0 332, and physical page n 334. Physical pages may include multiple packets, which may be grouped into error correction code (ECC) chunks.

In one embodiment, a physical page represents the smallest storage block within a given die that can be written to at a given time. In one embodiment, a logical page is the smallest writable storage block supported by the storage controller. (in one embodiment, the storage controller may include a buffer configured to store up to a logical page worth of data; upon filling the buffer, the storage controller may write the contents of the buffer to a single logical page simultaneously.) In some instances, dividing a logical page across multiple dies may result in faster access times for a set of data when multiple dies are accessed in parallel. The logical page configurations may be mapped to any physical page on a die, or across a plurality of memory die, just as with logical erase blocks.

In some embodiments, a storage controller 104 may associate metadata, also referred to as media characteristics, with one or more of the storage blocks (logical erase blocks, physical erase blocks, logical pages, and/or physical pages). The storage controller 104 may manage metadata that identifies logical addresses for which a logical erase block stores data, as well as the respective numbers of stored data packets for each logical erase block, data block, or sector within a logical address space 116 (FIG. 1). A storage controller 104 may store metadata or media characteristic data in a variety of locations, including on non-volatile storage media, in volatile memory, in a structure stored with each logical erase block, or the like.

"Metadata" refers to system data usable to facilitate operation of non-volatile storage device. Metadata stands in contrast to, for example, data produced by an application (i.e., "application data"), a user, a host, or forms of data that would be considered by an operating system as "user data."

For example, a logical erase block may include metadata specifying, without limitation, usage statistics (e.g., the number of program erase cycles performed on that logical erase block, health statistics (e.g., a value indicative of how often corrupted data has been read from that logical erase block), security or access control parameters, sequence information (e.g., a sequence indicator), a persistent metadata flag (e.g., indicating inclusion in an atomic storage operation), a transaction identifier, or the like. In some embodiments, a logical erase block includes metadata identifying the logical addresses for which the logical erase block stores data, as well as the respective numbers of stored data blocks/packets for each logical block or sector.

In certain embodiments, the metadata comprises a cross temperature for logical erase block, an average cross temperature for open logical erase blocks of the non-volatile storage device, a temperature change rate, an average program erase count for a logical erase block, an uncorrectable bit error rate (UBER) for a logical erase block, a bit error rate, a fail bit count for a logical erase block, and a charge leak rate. In one embodiment, metadata may comprise a media characteristic. "Charge leak rate" refers to a rate at which charge leaks from a memory cell when the memory cell is in a passive state, not being read or written to.

Figure 4:
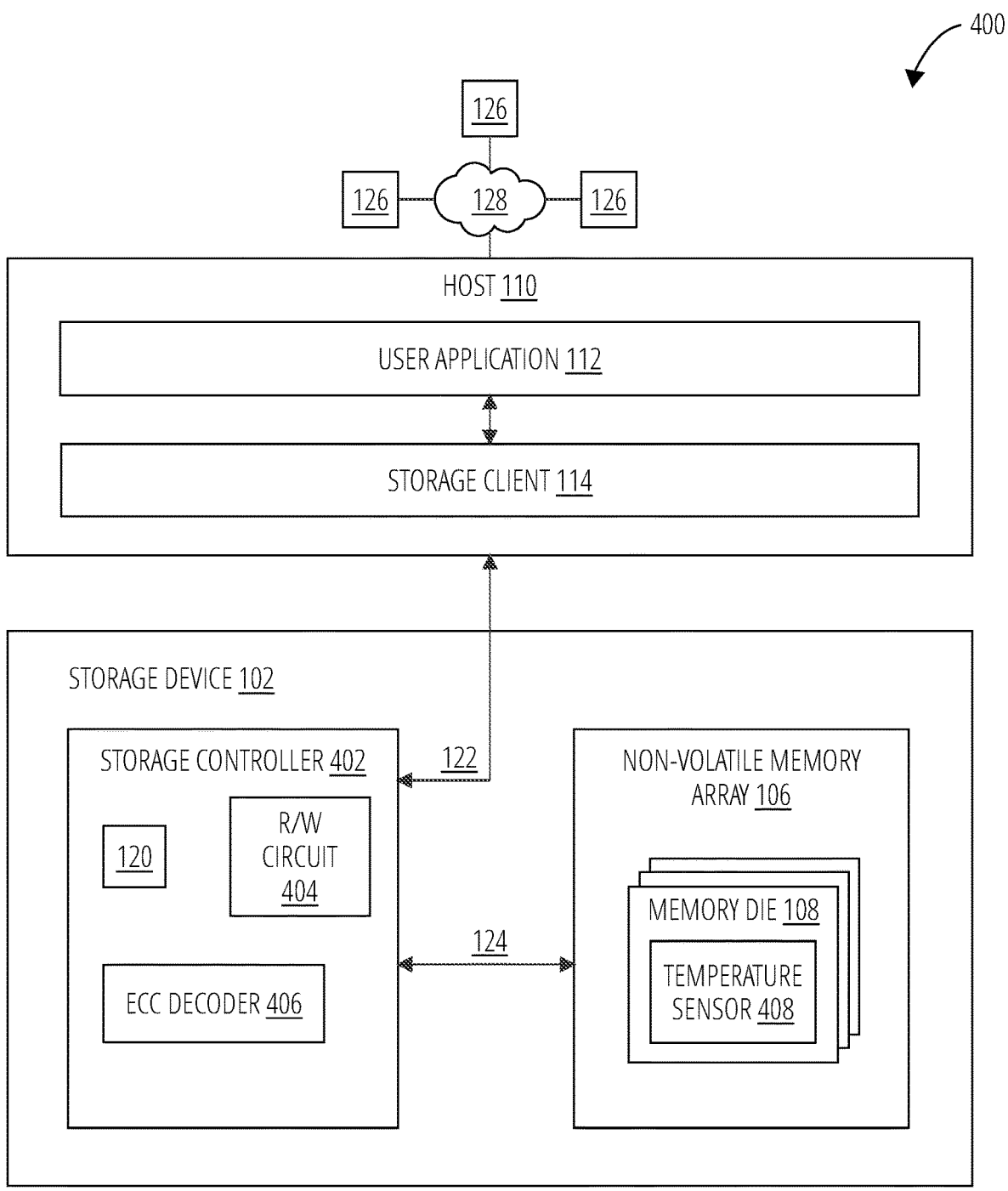
FIG. 4 is a block diagram of an example storage system 400 in accordance with one embodiment.

FIG. 4 illustrates a schematic block diagram of a storage system 400 in accordance with in one embodiment. In the storage system 400, the storage device 102 includes a storage controller 402 that comprises an R/W circuit 404, an error correction code decoder 406 and a flash translation layer 120. The non-volatile memory array 106 may comprise a plurality of memory dies 108, each having a temperature sensor 408.

The R/W circuit 404 or "Read write circuit" refers to a device, component, element, module, system, sub-system, circuitry, logic, hardware, or circuit configured and/or operational to read data from and write data to a storage media, such as storage cells of a storage array.

The error correction code decoder 406 may be configured to provide a bit error rate and error correction for data read by the R/W circuit 404. "Error correction code decoder" refers to any hardware, software, firmware, circuit, component, module, logic, device, or apparatus configured, programmed, designed, arranged, or engineered to detect and/or correct errors in a data set using redundancy information defined for the data set (e.g., a code word).

The error correction code decoder, in one embodiment, may comprise one or more types of decoder, including, but not limited to, a low density parity check (LDPC) decoder, a Reed-Solomon code decoder, a Golay code decoder, a Bose Chaudhuri Hocquenghem (BCH) code decoder, a turbo code decoder, a multidimensional parity code decoder, a Hamming code decoder, a Hadamard code decoder, an expander code decoder, a Reed-Muller code decoder, a Viterbi decoder, a Fano decoder, or the like.

The temperature sensor 408 allocated to each memory die 108 may provide a physical temperature reading at that die. "Temperature sensor" refers to any suitable technology that can implement a temperature sensor, including technology currently employed in conventional memory die temperature sensors. Also, it should be noted that while the temperature sensor may be located in the memory die in this embodiment, the temperature sensor may be located in another component in the storage system, such as the controller, or can be a separate component in the storage system.

Figure 5:
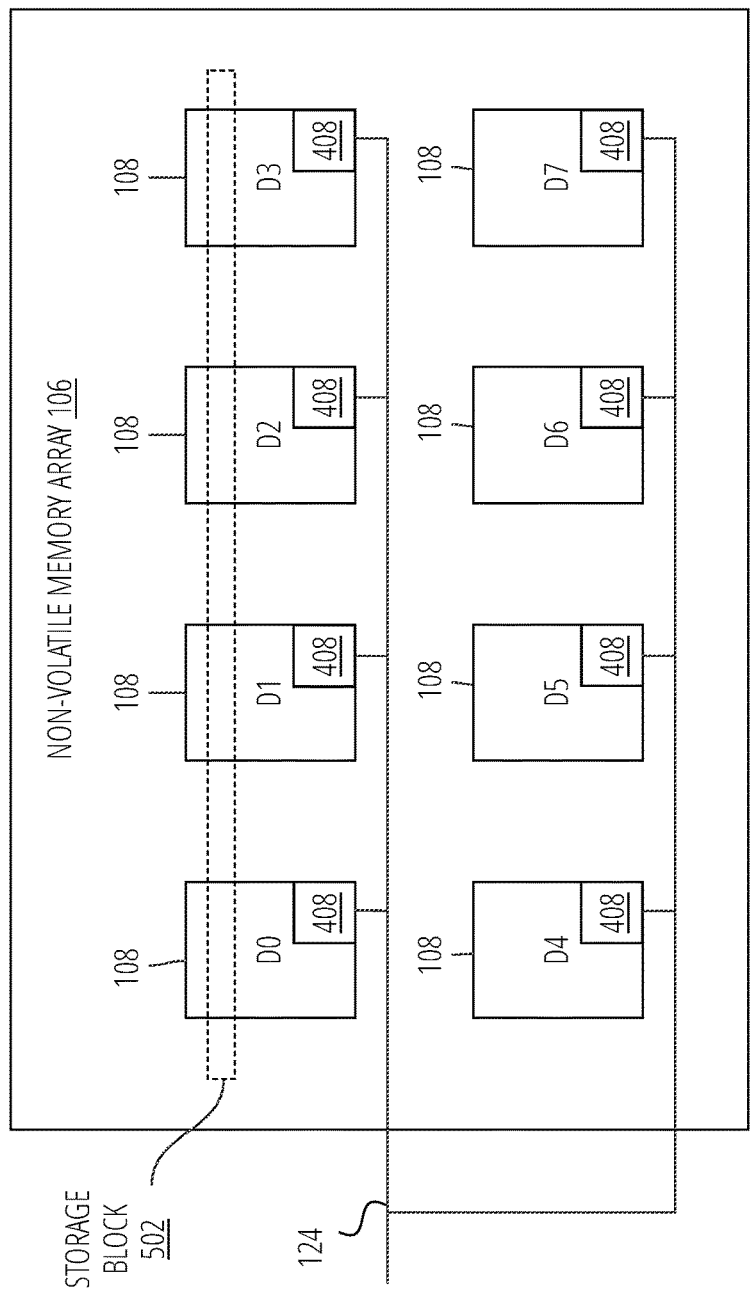
FIG. 5 illustrates a storage block configuration 500 in accordance with one embodiment.

FIG. 5 illustrates a storage block configuration 500 in accordance with one embodiment. A non-volatile memory array 106 may comprise a plurality of memory die 108. Each memory die 108 may incorporate a temperature sensor 408. Signals from the temperature sensors 408 indicating memory die temperature may be carried to the storage controller via a bus 124. A memory die may be configured to report record a die temperature at a particular interval, for example, every second. The value for the die temperature may reside in a control register on the memory die 108 and the memory die 108 may report the die temperature in response to a particular command from a storage controller. Alternatively, memory die may automatically report their die temperature and the current die temperatures may be retained in control registers of the storage controller.

FIG. 5 illustrates one example of a storage block 502. In this example, the storage block may be configured to span physical erase blocks on multiple memory die 108. For example, as illustrated, storage block 502 may comprise portions of, such as physical erase blocks, memory die D0, D1, D2, and D3. As a storage block is a logical structure, adjustments to a storage block configuration may be made to account for failed, worn out, or erroneous, physical erase blocks of the various memory die of the non-volatile memory array 106.

Figure 6:
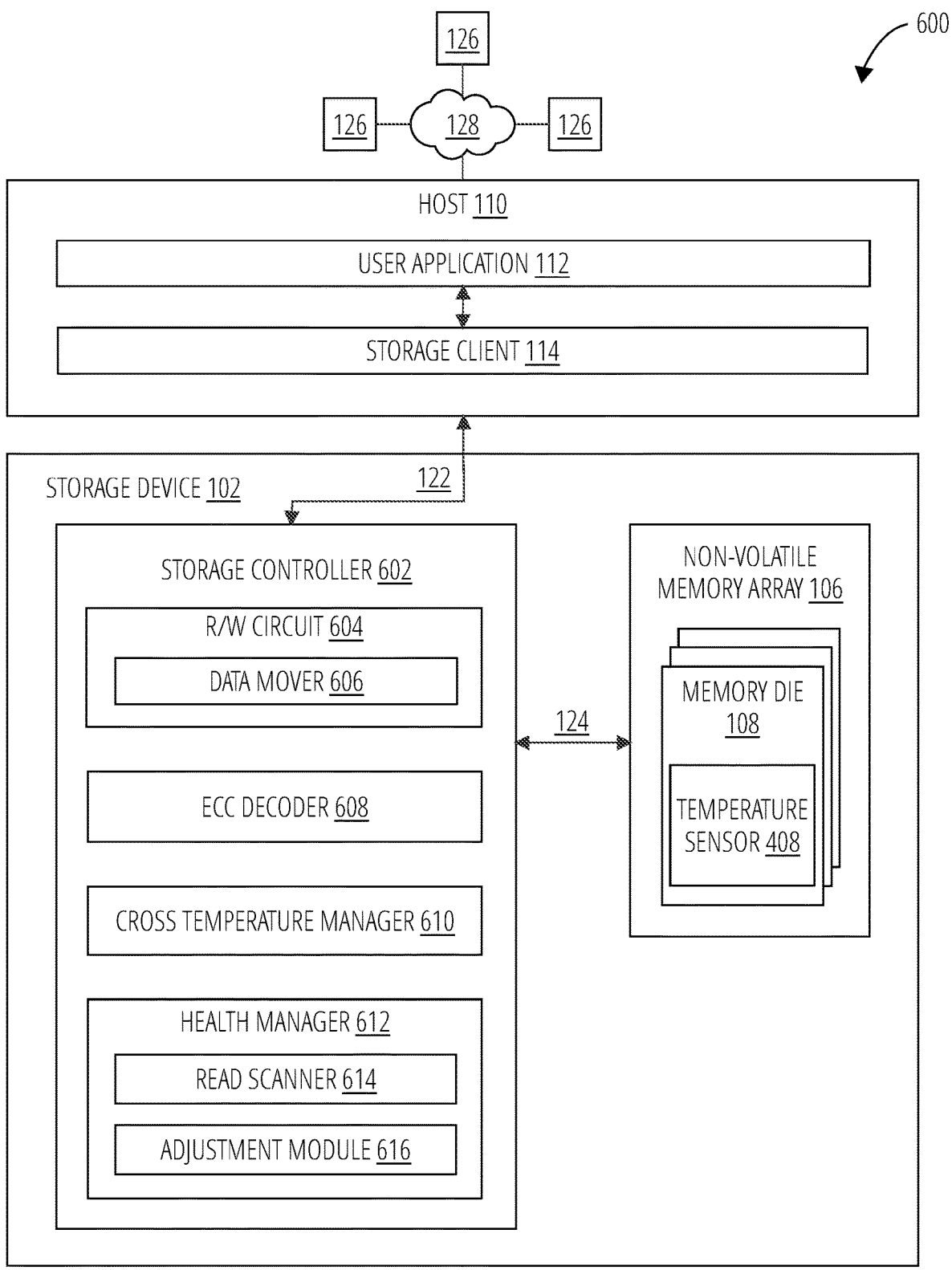
FIG. 6 is a block diagram of an example storage system 600 in accordance with one embodiment.

FIG. 6 is a schematic block diagram of a storage system 600 in accordance with one embodiment. The storage system 600 may include a storage device 102 that comprises a storage controller 602 and non-volatile memory array 106. The storage controller 602 may further comprise an R/W circuit 604 including a data mover 606, an error correction code decoder 608, a cross temperature manager 610, and a health manager 612 including a read scanner 614 and an adjustment module 616. Those of skill in the art will appreciate that these components may be incorporated within other parts of the storage device 102 or may be carried out by the host 110 in certain embodiments.

The R/W circuit 604 is configured to service storage operations to provide storage services to one or more storage clients 114. "Storage operation" refers to an operation performed on a memory cell in order to change, or obtain, the value of data represented by a state characteristic of the memory cell. Examples of storage operations include but are not limited to reading data from (or sensing a state of) a memory cell, writing (or programming) data to a memory cell, and/or erasing data stored in a memory cell. The R/W circuit 604 coordinates with the error correction code decoder 608 to service write commands and read commands.

"Write command" refers to a storage command configured to direct the recipient to write, or store, one or more data blocks on a persistent storage media, such as a hard disk drive, non-volatile memory media, or the like. A write command may include any storage command that may result in data being written to physical storage media of a storage device. The write command may include enough data to fill one or more data blocks, or the write command may include enough data to fill a portion of one or more data blocks. In one embodiment, a write command includes a starting LBA and a count indicating the number of LBA of data to write to on the storage media. "Read command" refers to a type of storage command that reads data from memory cells.

In one embodiment, the cross temperature manager 610 determine a cross temperature metric for a storage block. The cross temperature manager 610 may be further configured to monitor a cross temperature metric for each storage block of non-volatile memory array 106. In certain embodiments, the cross temperature manager 610 determines the cross temperature metric for a storage block being checked during a read scan operation.

The cross temperature manager 610 may determine a cross temperature metric by comparing a current die temperature with a die temperature when a storage block was last written to, referred to herein as a write temperature or programmed temperature. "Write temperature" or "programmed temperature" refers to a die temperature of a memory die or a non-volatile storage device when data is written or programmed to the memory die or non-volatile storage device. The die temperature when data was last written to a storage block may be stored in metadata or media characteristics with the storage block on the storage media, or in another set of tables or administrative data managed by the storage controller 602.

In one embodiment, the cross temperature manager 610 may track an average current die temperature for memory die that make up a storage block. In another embodiment, the cross temperature manager 610 may track each physical erase block of each storage block for cross temperature conditions. The cross temperature manager 610 may manage and/or maintain one or more cross temperature thresholds and/or one or more alert thresholds for the non-volatile memory array 106. "Threshold" refers to a level, point, or value above which a condition is true or will take place and below which the condition is not true or will not take place. (Search "threshold" on Merriam-Webster.com. Merriam-Webster, 2019. Web. 14 Nov. 2019. Edited.)

"Cross temperature threshold" refers to a type of threshold that is predefined such that when a value, rating, or condition satisfies the cross temperature threshold, the component, circuit, device, system, apparatus, or method is configured to signal either a cross temperature condition. "Alert threshold" refers to a type of threshold that is predefined such that when a value, rating, or condition satisfies the alert threshold, the system, apparatus, or method is configured to signal either a problem or error or a potential for an imminent problem or error condition.

One or more cross temperature thresholds and/or one or more alert thresholds may be defined such that there is one for each level, health, cross temperature, and/or the like. The cross temperature manager 610 may detect, determine, maintain, and/or calculate a cross temperature metric for each storage block. "Cross temperature metric" refers to a measure of a cross-temperature condition. In one embodiment, the cross temperature metric comprises a difference between a die temperature when a memory cell is programmed/written and a die temperature when a memory cell is read or attempted to be read.

In one embodiment, the cross temperature manager 610 may determine a cross temperature metric for a storage block being checked during a read scan operation. The cross temperature manager 610 may reduce a read scan interval when the cross temperature metric for the storage block being checked, tested, monitored, in a read scan operation satisfies a cross temperature threshold. If the storage block being checked, tested, or monitored in a read scan operation satisfies an alert threshold, the cross temperature manager 610 may initiate an immediate read scan operation for one or more other storage blocks.

The health manager 612, in one embodiment, may manage and monitor the health of the non-volatile storage media of the non-volatile memory array 106. In one embodiment, the health manager 612 executes a read scan operation on one or more, or each of the storage blocks of the non-volatile memory array 106. In this manner, the health manager 612 may manage health at the level of the storage blocks. As the health manager 612 detects storage blocks having a health condition that is causing more bit errors (a higher bit error rate), the health manager 612 may implement countermeasures to reduce a bit error rate, recover data, and/or extend the life of non-volatile storage media.

"Bit error rate" refers to a measure of a number of bits in error of a total overall number of bits processed. In certain embodiments, a bit error rate is calculated after an Error Correction Code (ECC) decoder has made one or more attempts to correct one or more bits in error.

"Countermeasure" refers to a method, process, step or operation configured to mitigate a negative attribute, factor, or condition. It should be noted that in certain instances a viable countermeasure is to take no action with respect to an identified negative attribute, factor, or condition. While taking no action may be considered a passive activity, such a response to a negative attribute, factor, or condition is considered a countermeasure herein.

In certain embodiments, a countermeasure is specific to a particular problem or indication of a problem. Examples of countermeasures, that may be used include actively changing a die temperature of erase blocks, relocating data of to another storage location, adjusting an alert threshold, managing one or more physical erase blocks using separate Cell Voltage Distribution (CVD) tables, and taking no action.

The health manager 612 may include a read scanner 614 and an adjustment module 616. The read scanner 614 reads data from storage blocks of the non-volatile memory array 106 and coordinates with the health manager 612 to determine a health for the storage cells of the storage block. The read scanner 614 may serve as part of the read scan operation and may check the condition of each storage block. For storage blocks having a deteriorated condition, the health manager 612 may implement countermeasures.

The read scanner 614 may read data from a storage block of a plurality of storage blocks of a non-volatile memory array 106 of memory die 108 associated with a plurality of temperature sensors. The read scanner 614 may coordinate with the error correction code decoder 608 to determine a bit error rate for each read of a storage block, this bit error rate may be called a read bit error rate. If the read bit error rate satisfies a read bit error rate threshold, the health manager 612 communicates with the R/W circuit 604 and data mover 606 to have the data of the storage block moved to a new storage block, a free storage block. The data mover 606 moves the data out of the storage block to the free storage block.

In certain embodiments, hot spots (localized elevated temperatures) may develop within certain memory die of a non-volatile memory array 106. These hot spots may cause data in storage cells of the hot spot to have higher bit error rates when read. In certain embodiments, as part of a read scan operation, the health manager 612 may be configured to detect these hot spots and implement countermeasures to address, remedy, or mitigate increased bit error rates and/or preserve data on the non-volatile storage media.

In one embodiment, the health manager 612 may determine that one or more storage blocks span a memory die having an elevated die temperature. In one embodiment, the health manager 612 makes this determination by comparing a current die temperature to a reference die temperature, such as a die temperature threshold. In particular, the health manager 612 may determine that the storage block spans a hottest memory die of a plurality of memory die 108 based on a die temperature. In one embodiment, the die temperature is reported by a temperature sensor 408 on each memory die. A hottest memory die may comprise a memory die of a plurality of memory die that for a row within non-volatile memory array 106 and the hottest memory die may be the memory die of the row having the highest die temperature.

If the health manager 612 determines that a storage block being read (i.e. Tested or checked) by the read scanner 614 spans a hottest memory die, the read scanner 614 may reduce a read scan interval for a read scan operation. This means that the read scan operation will be implemented sooner. The read scanner 614 may reduce the read scan interval by a fixed amount in one embodiment, e.g., 15 minutes. Alternatively, or in addition, the read scanner 614 may reduce the read scan interval by a percentage in one embodiment, e.g., 10 percent. Additionally, or in another embodiment, the read scanner 614 or the health manager 612 or the storage controller 602 may reduce the read scan interval. Additionally, or in another embodiment, the read scanner 614 or the health manager 612 or the storage controller 602 may increase a read scan frequency, for example by causing the health manager 612 or storage controller 602 to run a read scan operation more often. "Read scan frequency" refers to a measure of how often a read scan operation is performed within a specific time period.

In one embodiment, the storage controller 602 may include a health manager 612 having an adjustment module 616. The adjustment module 616 makes adjustments to parameters and settings used when performing storage operations with the non-volatile memory array 106. In one embodiment, a read scan operation may include use of the adjustment module 616.

In one embodiment, the adjustment module 616 manages the non-volatile memory array 106 by proactively setting and adjusting configuration parameters for storage cells of the non-volatile memory array 106. By determining configuration parameters proactively before an error occurs, the adjustment module 616 may prevent certain errors from occurring, without the performance penalty of retrying reads or performing other remedial measures for the prevented errors. The adjustment module 616, in certain embodiments, adapts configuration parameters for a use case of the storage device 102 to configure storage cells for the use case instead of using default configuration parameters.

A configuration parameter is a parameter of a set of storage cells that is modifiable by way of an interface, such as a read threshold, a write or program threshold, an erase threshold, or the like. An interface for modifying a configuration parameter may include a programmable data register, a command interface of a control bus for the non-volatile memory array 106, an API of a device driver of the storage device 102, a control parameter for the storage controller 104, or the like.

The adjustment module 616 references one or more media characteristics for a set of storage cells to determine a configuration parameter for the set of storage cells.

"Characteristic" refers to any property, trait, quality, or attribute of an object or thing. Examples of characteristics include, but are not limited to, condition, readiness for use, unreadiness for use, size, weight, composition, feature set, and the like. "Media characteristic" refers to an attribute or statistic for a set of particular storage cells, such as a program/erase cycle count for the set of storage cells, a read count for the set of storage cells, a retention time since a previous write for the set of storage cells (aka a data retention time), a dwell time for the set of storage cells such as a logical or physical erase block (e.g., a time between a program of an erase block and an erase of the erase block), an average of multiple previous dwell times for the set of storage cells, an error statistic for the set of storage cells, or the like.

A media characteristic for a set of storage cells may be substantially static or may be dynamic and change over time. A media characteristic, in one embodiment, is a statistic, heuristic, mathematical model, transform, or other descriptor associated with an attribute of the non-volatile memory media.

A media characteristic, in one embodiment, includes or relates to a make, a model, a manufacturer, a product version, or the like for the storage device and/or for the non-volatile memory media. A media characteristic, in a further embodiment, may include or relate to an environmental condition or a use of the storage device and/or of the non-volatile memory media, such as a temperature, a use case (e.g., a cache use case, an archival use case, a server use case, an enterprise use case, a consumer use case, etc.), or the like.

The adjustment module 616, in response to determining a configuration parameter for a set of storage cells, may configure the set of storage cells to use the determined configuration parameter. The adjustment module 616 may periodically update media characteristics for a set of storage cells, update a configuration parameter for the set of storage cells, and reconfigure the set of storage cells to use the updated configuration parameter. The adjustment module 616 may configure storage cells with configuration parameters during execution of input/output operations, during a startup operation, in response to a background scan of a set of storage cells indicating a changed media characteristic, or the like.

In order to reduce the overhead associated with tracking configuration parameters for each storage cell, each page, each erase block, or the like, in one embodiment, the adjustment module 616 may manage configuration parameters in groups or sets. For example, the adjustment module 616 may determine and manage configuration parameters for groups or sets of pages, physical erase blocks, logical erase blocks, metablocks, super blocks, storage blocks, word lines, error correction code chunks or codewords, chips, die, planes in a die, or other storage regions. The adjustment module 616 may group pages or other storage regions that have similar media characteristics, such as similar error rates, similar ages, similar PE cycle counts, similar physical media locations, similar locations in a programming order, similar architectures, similar temperatures or cross temperatures, or the like, and determine different configuration parameter settings for the different groups. For example, the adjustment module 616, in certain embodiments, may group upper pages (e.g., MSB pages), lower pages (e.g., LSB pages), subsets of upper and/or lower pages, a set of the first N pages in a page programming order, a set of the middle N pages in a page programming order, a set of the last N pages in a page programming order, and/or other subsets of pages or other storage regions, and may manage configuration parameter settings by group or set.

In one embodiment, a read scan operation may include use of the adjustment module 616. In one embodiment, if the read scanner 614 determines that the bit error rate for a storage block exceeds a certain threshold, the read scanner 614 may signal the adjustment module 616 to determine an adjustment for the storage block, if one can be made.

In one example embodiment, of the adjustment module 616 operating in connection with a read scan operation, the adjustment module 616 may iteratively attempt to read data of the storage block using a predetermined number of different read levels. "Read level" refers to a voltage level configured to test, or check, which memory cells conduct at the voltage level. In certain embodiments, the memory cells may comprise transistors and the read voltage is a voltage level at, or above the threshold voltage for the memory cells which causes the memory cell to conduct a current.

In certain embodiments, depending on the type of encoding used to store data on the memory cell and the number of bits encoded on each memory cell, a single read/sense operation using a single read voltage may be determinative of the memory state of the memory cell. In other embodiments, a number of read/sense operations each performed at different read voltage levels may be used to determine the memory state of the memory cell. The determined memory state may then be decoded into a representation of the data bits stored by the memory cell. "Read voltage" is a shorthand reference to a "read threshold voltage." "Read level" is another term commonly used to describe a "read voltage" and the two terms are used interchangeably herein.

In response to successfully reading the data of the storage block via a last of a predetermined number of different read levels in the iterative attempts, the adjustment module 616 may determine the bit error rate for the data of the storage block read and may reduce the read scan interval for a read scan operation in response to the bit error rate satisfying the read bit error rate threshold. In this manner, the disclosed solution may reconfigure storage blocks containing memory cells impacted by cell threshold voltage distribution shifts. Alternatively, or in addition, the adjustment module 616 may be configured to schedule a subsequent read scan operation to start with a storage block for which the adjustment module 616 has made an adjustment.

In certain embodiments, the storage controller 602 may be configured to implement a countermeasure as part of a read scan operation in which the countermeasure includes cooling one or more memory die of a non-volatile memory array 106. For example, in one embodiment, the storage controller 602 may be configured to cool a memory die that is the hottest memory die of the plurality of memory dies 108 that together form a storage block being checked by the read scan operation. In one embodiment, the storage controller 602 cools the hottest memory die by activating active cooling systems or subsystems such as fans, liquid cooling, or the like.

In one embodiment, the storage controller 602 cools the hottest memory die by instructing the R/W circuit 604 to direct incoming write commands from the host to one or more storage blocks that do not include the hottest memory die. By redirecting write commands away from one or more storage block that use the hottest memory die, the hottest memory die may have an opportunity to cool due to natural heat dissipation. Alternatively, in addition, or in another embodiment, the storage controller 602 may cool the hottest memory die by instructing the data mover 606 to move data for each storage block spanning the hottest memory die to another set of storage blocks, and to temporarily stop using (reading and writing to) the hottest memory die such that this die cools through nonuse.

Figure 7:
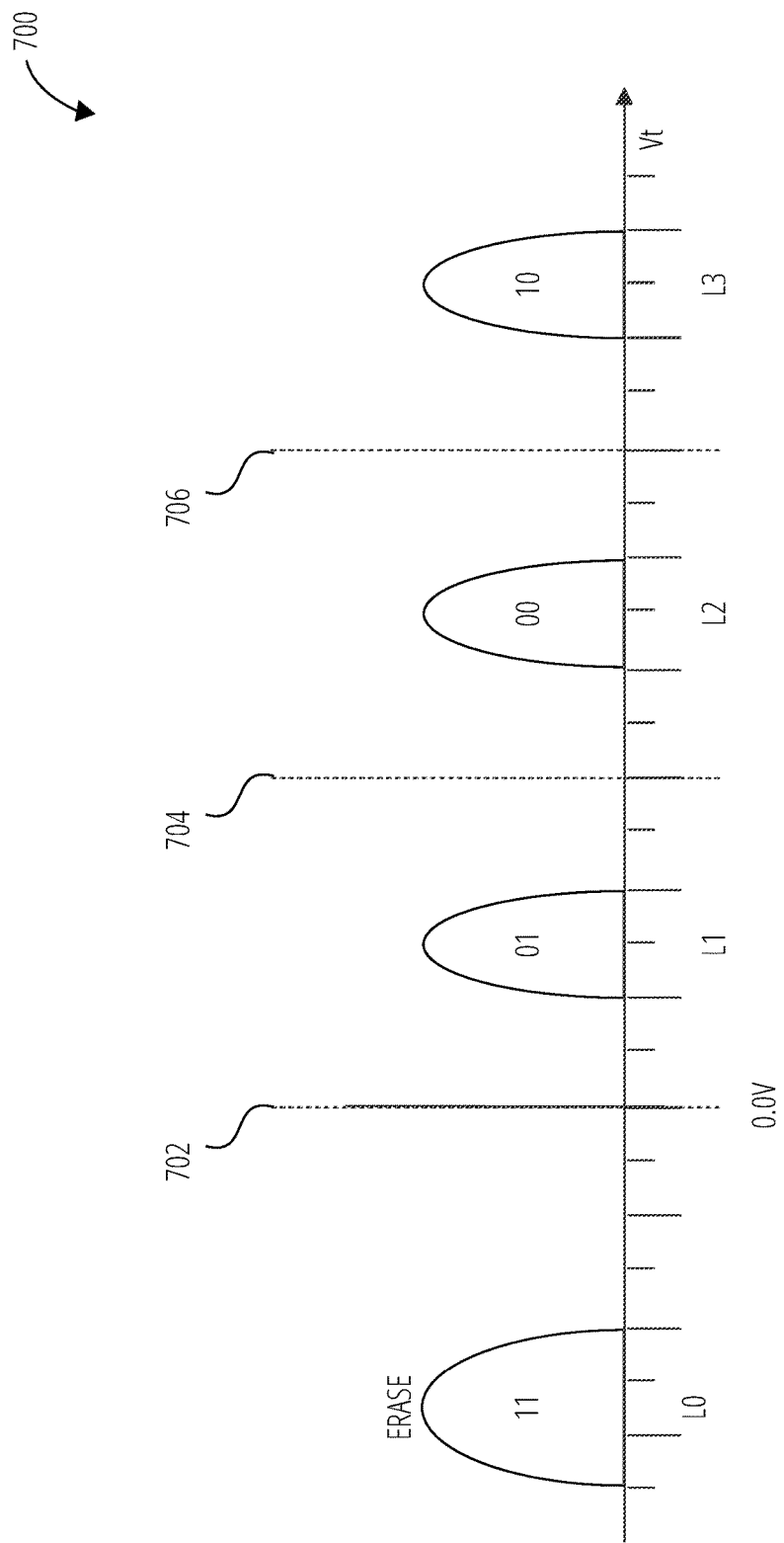
FIG. 7 illustrates configuration parameters for multi-level storage cells 700 in relation to one embodiment.

FIG. 7 shows a graph of cell threshold voltage distributions and configuration parameters for multi-level storage cells 700 such as multi-level NAND flash storage cells, or the like, with an example encoding or programming model. The memory states, in the depicted embodiment, are encoded using a Gray code encoding model, with binary values for adjacent memory states differing by a single bit in the encoding. "Memory state" refers to a condition of a memory cell, or storage cell, designed and/or configured to represent an encoding for one or more data bit values. In certain embodiments, the memory state may be changed by using a storage operation. In a non-volatile memory cell, the memory cell maintains its memory state without a power source.

"Cell threshold voltage distribution" refers to a process or method for determining a threshold voltage for each memory cell in a set of memory cells. Cell threshold voltage distribution may be referred to as direct cell voltage distribution and may be referred to using the acronym "CVD."

A cell threshold voltage distribution may be performed during research and development of non-volatile memory technology to understand how memory cells behave in different conditions. In certain embodiments, a cell threshold voltage distribution may be performed during operation of non-volatile memory to determine whether the read levels being used to read a memory cell are adequate. If a bit error rate for a first set of read levels is inadequate, countermeasures may be taken to reduce the bit error rate.

In certain embodiment, these countermeasures may include adjusting configuration parameters such that a bit error rate decreases. In certain embodiments, the steps of determining a cell threshold voltage distribution, checking read levels and other media characteristics with respect to bit error rate, and taking any countermeasures, may be referred to as a CVD scan. A CVD scan may require significant time to complete due to the various steps involved and the number of memory cell being scanned. "Threshold voltage" refers to a voltage level that when applied to a gate electrode of a transistor causes the transistor to conduct a current between the drain electrode and source electrode.

FIG. 7 shows that the value "11" is associated with the lowest memory state (labeled L0, an "erase" state), the value "01" is associated with the next lowest read voltage state (labeled L1), the value "00" is associated with the next highest read voltage state (labeled L2), and the value "10" is associated with the highest read voltage state (labeled L3). In FIG. 7, the lowest memory state L0 is depicted as a negative voltage below the depicted 0.0V. Values, magnitudes, sizes, and the like of read voltages may vary by manufacturer and type of non-volatile memory cell, each of which are encompassed by this disclosure. Default read level 702, default read level 704, and default read level 706, in the depicted embodiment, are read levels that separate memory states L0 and L1, L1 and L2, and L2 and L3, respectively. Default read level 702, default read level 704, and default read level 706, are one example of media characteristics or metadata.

A non-volatile memory storage controller may interpret the four discrete levels of voltage stored in a multi-level storage cell as representing two binary bits, one represented by a most significant bit (MSB) in the cell encoding and one represented by a least significant bit (LSB) in the cell encoding. Other programming and encoding models may be used. Also, certain non-volatile memory media may have more than four possible states, allowing more than two binary values to be stored in a single multi-level storage cell. The memory states L0, L1, L2, and L3 may or may not be contiguous; for example, in certain embodiments, the voltage levels are separated by band gaps known as guard bands. For example, L0 and L1 may be separated by 0.3V.

In one embodiment, the LSB corresponds to a lower page of data and the MSB corresponds to an upper page of data. In certain embodiments, a multi-level storage cell may adhere to a two-phase programming model, which includes writing the LSB before the MSB can be written or vice versa. In another embodiment, the LSB and MSB may be programmed separately by the storage controller. Such an approach may be taken due to vendor or manufacturer requirements for page pairing (e.g., an LSB bit of MLC cell is paired with an MSB bit of a different MLC cell) and page addressing (e.g., LSB page is be programmed before the MSB page or vice versa). In certain instances, the LSB is written before the MSB is written, the MSB is written before the LSB is written, or the like.

In certain embodiments, the non-volatile memory media may employ a two-phase programming model. In such a model, a binary value is first written to the LSB by way of a first write command to the lower page. The write command causes the multi-level storage cell to move from its initial state (for example, a 11 state in L0) to an intermediate state (the lower-to-middle LM state between L1 and L2) configured such that a 00 state is subsequently read. For example, writing a "0" to the lower page causes the multi-level storage cell to change from the L0 state (where both the LSB and the MSB are 1) to the L2 state (where the LSB is changed to a 0). A subsequent write of a "0" to the upper page moves the multi-level storage cell from the intermediate state (typically between the L1 state and the L2 state) to L2 state such that both bits of the MLC are "0".

Thus, in such an embodiment, two writes (one to the lower page and one to the upper page) are needed to move the multi-level cell from L0 to L2, since the cell transitions through the intermediate state and the MLC device includes programming the lower page before programming the upper page and does not allow partial programming of a page without an intervening erase operation. Writing a "1" to either of the upper page or lower page will cause the MLC to transition to either L1 or L3 depending on the binary value of the lower page at the time. In addition, certain non-volatile memory media vendors may impose a requirement that the lower page be written to before the upper page, or the like. In other embodiments, the non-volatile memory media may employ a two-phase programming model where a binary value is first written to the MSB by way of a first write command to the upper page.

In certain embodiments, an adjustment module 616 determines and manages read levels or other configuration parameters individually for one or more of the abodes (i.e. Memory states) L0, L1, L2, L3, determining different settings or adjustments to configuration parameters in different abodes L0, L1, L2, L3. In one embodiment, an adjustment module adjusts one or more read levels based on a subset of binary data that multi-level storage cells store, such as just an upper page, just a lower page, or the like. In such embodiments, examining the state changes for the LSB bit(s) indicate the direction the voltage in the multi-level storage cell is changing. For both Gray code encoding (as depicted in FIG. 7) and binary code encoding of bit values, the LSB of a multi-level storage cell transitions between a binary zero and a binary one between the middle two abodes or states, the L1 state and the L2 state in the depicted embodiment.

For other encoding models, the MSB may transition between a binary zero and a binary one between the middle two abodes or states, or the like. For Gray code or binary code encoding models, the LSB has a value of "1" for read voltages in a lower range (including the lower two states or abodes, L0 and L1) and the LSB has a value of "0" for read voltages in an upper range (including the upper two states or abodes, L2 and L3). By using just the LSB of MLC storage cells to determine whether a read level deviates from a known read level, the adjustment module, in one embodiment, may make the determination in a similar manner to determining whether a read level for SLC storage cells deviates from a known read level, by counting or tallying binary ones and/or binary zeroes of an LSB data set, or the like.

For certain types of multi-level storage cells, default read level 704 (e.g., the middle read level) and the adjacent L1 and L2 states may be more sensitive to read disturb or other factors that can cause read voltages to drift. Further, in certain embodiments, the LSB and the MSB of a single multi-level storage cell may represent data stored in different physical pages. Using a single bit from each of a plurality of multi-level storage cell as a data set, in one embodiment, may reduce a number of read operations to retrieve the data set. In other embodiments, use of a single bit from each of a plurality of multi-level storage cells in the lower page simplifies a process of detecting a deviation and direction of a read level from a known read level for multi-level storage cells.

In one embodiment, a direction module may determine a direction of deviation for a grouping of multi-level storage cells based on a data set that includes data from one or more lower pages of the multi-level storage cells. Because the lower pages include the LSBs, in certain embodiments, the direction module determines that a read level deviates toward a larger read voltage in response to a difference between a read level for the lower pages and a known read level for the lower pages indicating that storage cell values for the LSBs have transitioned from a binary one to a binary zero. For an LSB to transition from a binary one to a binary zero, a read voltage for a multi-level storage cell using the encoding model of FIG. 7 drifts from either an L0 or L1 state to an L2 or L3 state, indicating that one or more of the read levels (702, 704, 706) should be increased, to place the read voltage back in the original L0 or L1 state.

Similarly, in certain embodiments, a direction module may determine that a read level deviates toward a smaller read voltage in response to a difference between a read level for the lower pages and a known read level for the lower pages indicating that storage cell values for the LSBs have transitioned from a binary zero to a binary one. For an LSB to transition from a binary zero to a binary one, a read voltage for a multi-level storage cell may drift from either an L3 or L2 state to an L1 or L0 state, indicating that one or more of the read levels should be decreased, to place the read voltage back in the original L3 or L2 state. In certain embodiments, a deviation across multiple states may be unlikely, and deviations detectable using LSBs may be between the L1 and L2 states, indicating a clear direction of deviation in either direction.

In another embodiment, a direction of deviation may be determined based at least partially on an encoding type used for storage cells of the non-volatile memory media, a physical and/or electrical architecture of the storage cells of the non-volatile memory media, or the like. For example, the direction of deviation may be determined based on a 2-bit multi-level storage cell media type, based on whether the data set includes an upper page or a lower page, based on the Gray code encoding type, based on a magnitude of the determined deviation, or the like. In a further embodiment, LSBs and MSBs from separate or disparate addresses, such as different physical pages or the like, may be transformed or combined into a single data set or may be otherwise coordinated to determine a direction of deviation.

Using each bit stored in multi-level storage cells to determine a read level adjustment, in certain embodiments, can increase the accuracy of the read level adjustment, but may increase the number of read operations or add complexity to the determination. In one embodiment, if the error correction code decoder 608 illustrated in FIG. 6 detects a data error in an upper page of a grouping of multi-level storage cells, the R/W circuit 604 may retrieve one or more lower pages for the grouping, and the adjustment module 616 may adjusts a read level for the grouping based on the lower pages.

Figure 8:
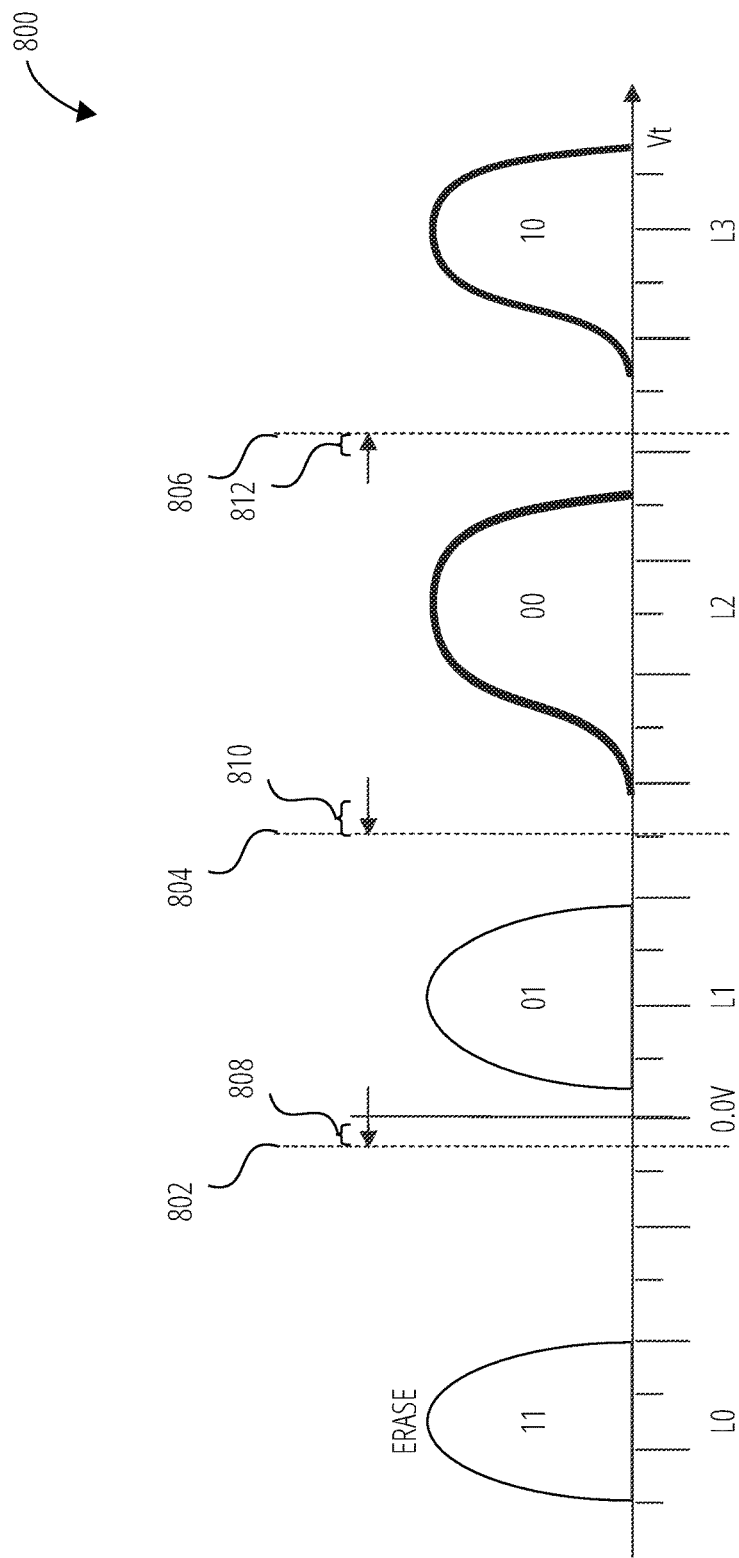
FIG. 8 illustrates adjusted configuration parameters for multi-level storage cells 800 in accordance with one embodiment.

FIG. 8 depicts one embodiment of adjusted configuration parameters for multi-level storage cells 800, showing the adjusted read level 802, adjusted read level 804, and adjusted read level 806 for a set of multi-level storage cells of non-volatile memory media. In certain embodiments, read levels are default configuration parameters, set by a manufacturer, a vendor, or the like and the adjustment module (e.g., adjustment module 616) may adjust or configure the default read level 702, default read level 704, and default read level 706 illustrated in FIG. 7 to the adjusted read level 802, adjusted read level 804, and adjusted read level 806, respectively. The adjustment module, in one embodiment, determines different adjustments to the default read levels, resulting in the adjusted read levels. In the depicted embodiment, the adjustment module may determine adjustment 808, adjustment 810, and adjustment 812 individually for the different abodes L0, L1, L2, L3, with different magnitudes, different directions, and the like, customizing the different adjusted read level 802, adjusted read level 804, and adjusted read level 806 individually to media characteristics of the different abodes L0, L1, L2, L3.

The adjusted read levels more closely match the actual distributions of storage cell states of FIG. 8 than do the default read levels in FIG. 7. Were a corresponding set of storage cells to use default read level 702, default read level 704, and default read level 706 with the distributions of storage cell states of FIG. 8, the portions of the distributions that have drifted past the locations of the default read levels would register data errors. Similarly, because the charge levels of the different abodes L0, L1, L2, L3 have drifted, leaked, been disturbed, or the like by different amounts and in different directions, using the same adjustment for each abode L0, L1, L2, L3, in certain embodiments, may register data errors. By configuring the corresponding set of storage cells to use the individually adjusted configuration parameters, the adjustment module and may prevent, avoid, or correct the potential data errors.

In one embodiment, the adjustment module 616 determines the adjusted configuration parameters adjusted read level 802, adjusted read level 804, and adjusted read level 806, reactively using a deviation module, a direction module, an adjustment module, or the like. In another embodiment, the adjustment module determines the adjusted read levels proactively using a media characteristic module and an adjustment module 616, based on media characteristics for a corresponding set of storage cells.

A process for an adjustment module 616 determining adjusted read level 802, adjusted read level 804, and/or adjusted read level 806 is a form of maintenance in which the storage controller 104 manages the non-volatile memory array 106 to compensate for wear and deterioration as the storage device 102 is used. The process of the adjustment module 616 determining and making these adjustments may be referred to as a CVD scan because the process may involve determining a threshold voltage for each storage cell of a storage block.

A CVD scan may be executed as an independent maintenance operation or in connection with other operations. In one embodiment, the CVD scan may be run in conjunction with a read scan operation.

Figure 9:
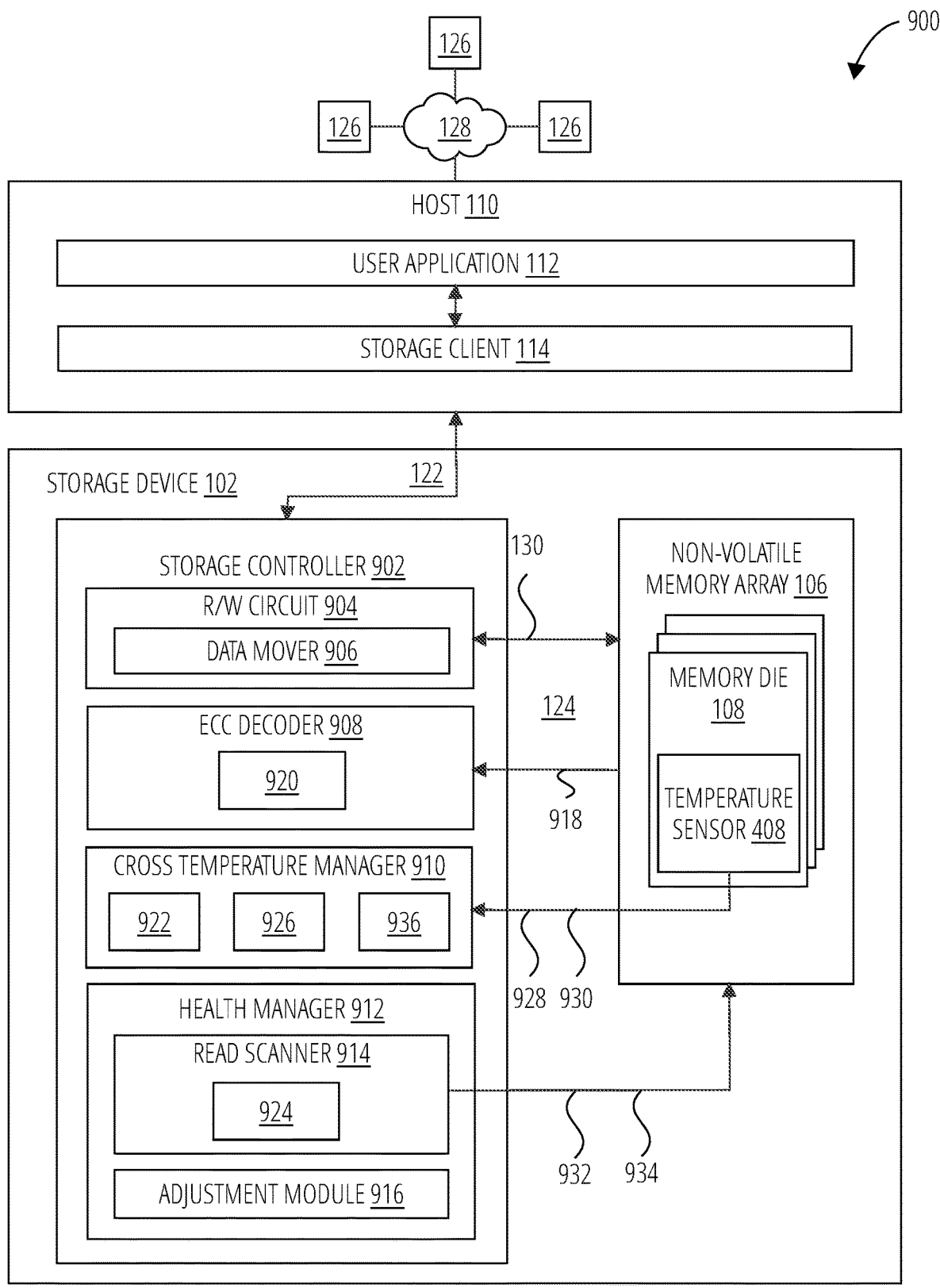
FIG. 9 is a block diagram of an example storage system 900 in accordance with one embodiment.

FIG. 9 is a schematic block diagram of a storage system 900 in accordance with one embodiment. The storage system 900 comprises a plurality of storage blocks implemented across memory die 108 of a non-volatile memory array 106 and a storage controller 902. The storage controller 902 may comprise an R/W circuit 904 having a data mover 906, an error correction code decoder 908, a cross temperature manager 910, and a health manager 912 comprising a read scanner 914 and an adjustment module 916.

The storage controller 902 may determine a storage block of the plurality of storage blocks having a bit error rate 918 above a read bit error rate threshold 920 through the action of an error correction code decoder 908. The determination that the bit error rate 918 is above, or satisfies, a read bit error rate threshold 920 may be done as part of a read scan operation and/or may be done as part of a CVD scan in which the storage controller 902 seeks to find adjusted read levels.

In one embodiment, as part of doing a CVD scan, a storage controller 902 may also determine to change a read scan interval for a read scan operation. As part of the CVD scan, the storage controller 902 may iteratively read data (or attempt to read the data if there is too many errors to correctly read the data) from the storage block using a predetermined number of different read levels through the action of the read scanner 914. In one example, each iterative read of the data may use read levels that are more likely to correct and/or avoid a bit error rate for a last read. When an iterative read of the data results in a higher bit error rate, the storage controller 902 may use the read levels for a last iterative read as adjusted read levels. In response to successfully reading storage block data through the iterative attempts, the adjustment module 916 may be used to change one or more of the read levels of the storage block to one or more of the predetermined number of different read levels that resulted in the successful data read.

Examples of predetermined number of different read levels 1010 are illustrated in FIG. 10 as part of a table of configuration parameters 1000. The table of configuration parameters 1000 includes rows of storage blocks, each having a storage block identifier 1002. The table of configuration parameters 1000 includes three example read levels, read level R1 1004, read level R2 1006, and read level R3 1008. Of course, more read levels may be used in other embodiments for the predetermined number of different read levels 1010.

For example, SB0, row 1012, may be read using read level R1 1004, which may return too high a bit error rate 918. The storage controller 902 may configure the read scanner 914 to attempt to read SB0 using read level R2 1006, which may still incur too high a bit error rate 918. Finally, the read scanner 914 may read SB0 using read level R3 1008, which may still incur errors, but may reduce the bit error rate 918 to below the read bit error rate threshold 920. The adjustment module 916 may then change the configuration of SB0 to be read using read level R3 1008. Once the one or more read levels have been changed, the storage controller 902 may instruct the read scanner 914 to reduce the read scan frequency of the storage blocks, such that storage blocks are scanned more often. In this manner, the read scan frequency may be adjusted dynamically based on one or more of a CVD scan and/or a read scan operation.

In one embodiment, the storage controller 902 may include a cross temperature manager 910 configure to determine a cross temperature metric 922 for the storage block. The cross temperature manager 910 may instruct the read scanner 914 to change a read scan frequency 924 when the cross temperature metric 922 for the storage block satisfies a cross temperature threshold 926. The cross temperature manager 910 may determine the cross temperature metric 922 by first determining a write temperature 928 for the storage block data, then determining a current temperature 930. The cross temperature metric 922 may comprise a difference between the write temperature 928 and current temperature 930. In addition to changing a read scan frequency as part of a CVD scan and/or read scan operation, in certain embodiments, the read scan frequency may be changed based on a cross temperature metric 922 for a storage block.

The storage controller 902 may be configured to execute a plurality of read scan operations such as a read scan operation 932 and a subsequent read scan operation 934. In some embodiments, the storage controller 902 may further measure a data retention die temperature threshold 936. It will be recognized by one of ordinary skill in the art that, while these parameters are indicated where functionally convenient, the illustration is not intended to limit the configurations of circuitry constructed to implement this functionality within the storage controller 902.

FIG. 10 depicts an embodiment of a table of configuration parameters 1000. The table of configuration parameters 1000 includes a plurality of rows 1012 for sets of storage cells. The sets of storage cells, storage blocks, in the depicted embodiment, are organized by storage block identifier 1002, and the rows 1012 correspond to storage blocks 1002 from SB0 through SBn. Each row 1012 further includes configuration parameters 1014 for the corresponding storage block identifier 1002. The configuration parameters 1014, in the depicted embodiment, include read voltage threshold adjustment for a read level which includes read level R1 1004, read level R2 1006, and read level R3 1008, with each entry as a hexadecimal offset from default read voltage thresholds. For example, in the depicted embodiment, the read voltage threshold adjustments vary between FAh (a hexadecimal number corresponding to decimal number −6, in a two's complement representation where "h" represents hexadecimal) and 05h (a hexadecimal number corresponding to decimal number 5), including values such as 01h, 02h, 04h, FEh, FCh, FDh, FAh, 03h, and 05h. Thus, the table of configuration parameters 1000 may contain a predetermined number of different read levels 1010 used in read scan operations and/or CVD scan operations, as discussed with regard to FIG. 11 below.

While the configuration parameters 1014 in the depicted embodiment are illustrated as read voltage threshold adjustments, as described above, in other embodiments, configuration parameters 1014 may include resistivity thresholds, write or program thresholds, erase thresholds, and/or other modifiable parameters of the non-volatile memory media. Further, the three configuration parameters 1014 are provided by way of example and, in other embodiments, other amounts and types of configuration parameters may be included. For example, in one embodiment, certain 20 nm non-volatile memory media, or the like, may have ten different read voltage thresholds R1-R10, set using different registers or the like, and an adjustment module 616 may determine different values for R1-R10 for different sets, groups, storage regions, and/or different abodes/storage states. Configuration parameters 1014 may include an absolute data values, offset or adjustment to a data values, other parameters. A configuration update module may cooperate with an adjustment module 616 to update the table of configuration parameters 1000.

Figure 11:
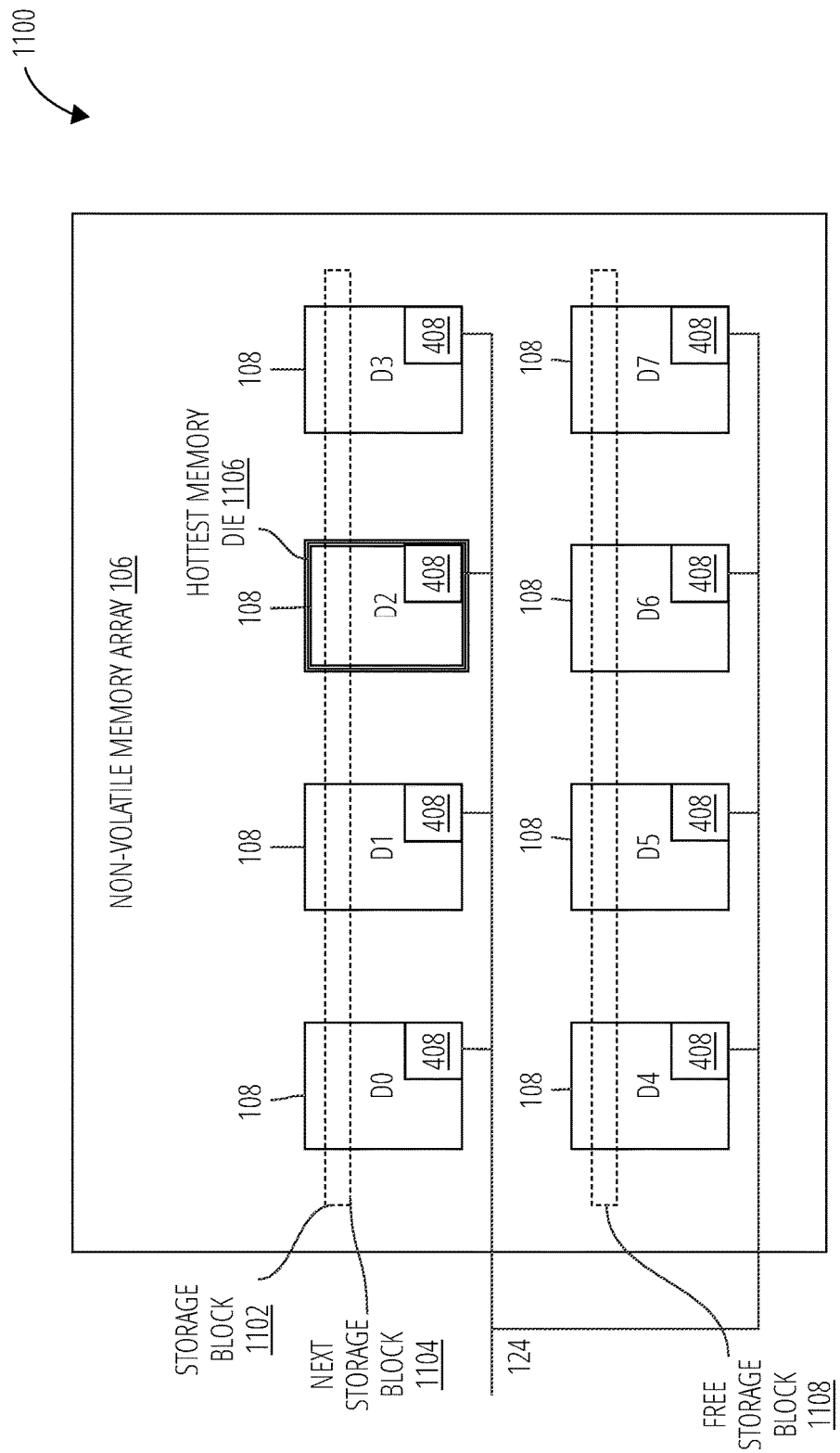
FIG. 11 illustrates a storage block configuration 1100 in accordance with one embodiment.

FIG. 11 illustrates a storage block configuration 1100 in accordance with one embodiment. A storage block 1102 is shown that is one of a plurality of storage blocks. This plurality of storage blocks may include a next storage block 1104 and a hottest memory die 1106, as illustrated.

Each of the plurality of storage blocks may span a plurality of memory die, such as the memory dies 108 illustrated within the non-volatile memory array 106. Each memory die 108 may incorporate a temperature sensor 408 capable of providing a die temperature.

A typical non-volatile memory array 106 may comprise eight to sixteen memory dies 108, such as the D0, D1, D2, D3, D4, D5, D6, and D7 illustrated. In determining a hottest memory die 1106, all of the memory dies 108 of the non-volatile memory array 106 may be considered, not just those spanned by a storage block 1102 under consideration. In the illustrated instance, then, D2 is not just the hottest memory die 1106 of the four memory dies 108 spanned by storage block 1102 (D0-D3). D2 may be understood to be the hottest memory die 1106 of the entire non-volatile memory array 106 (D0-D7).

The storage controller in communication with the non-volatile memory array 106 may include a health manager, such as the health manager 912 shown in FIG. 9. When the storage controller iteratively attempts to read the data in storage block 1102, the health manager may determine that the storage block 1102 comprises a hottest memory die 1106 of the plurality of memory dies 108 based on the die temperature for each memory die 108 the storage block spans. The health manager may change a read scan frequency in response to determining that the storage block 1102 comprises the hottest memory die 1106.

In one embodiment, the health manager may queue the storage block 1102 that includes the hottest memory die 1106 as a next storage block 1104 for a subsequent read scan operation. In another embodiment, the health manager may be configured to reconfigure the storage block 1102 to exclude the hottest memory die 1106. For example, in such a configuration, storage block 1102 may include D0, D1, D6, and D3, rather than D2. The storage controller may also be configured to move data from the storage block 1102 including the hottest memory die 1106 to a free storage block 1108 which does not span the hottest memory die 1106. "Free storage block" refers to a storage block that is available to receive data for writing to storage cells of the storage block as a result of a storage command.

Figure 12:
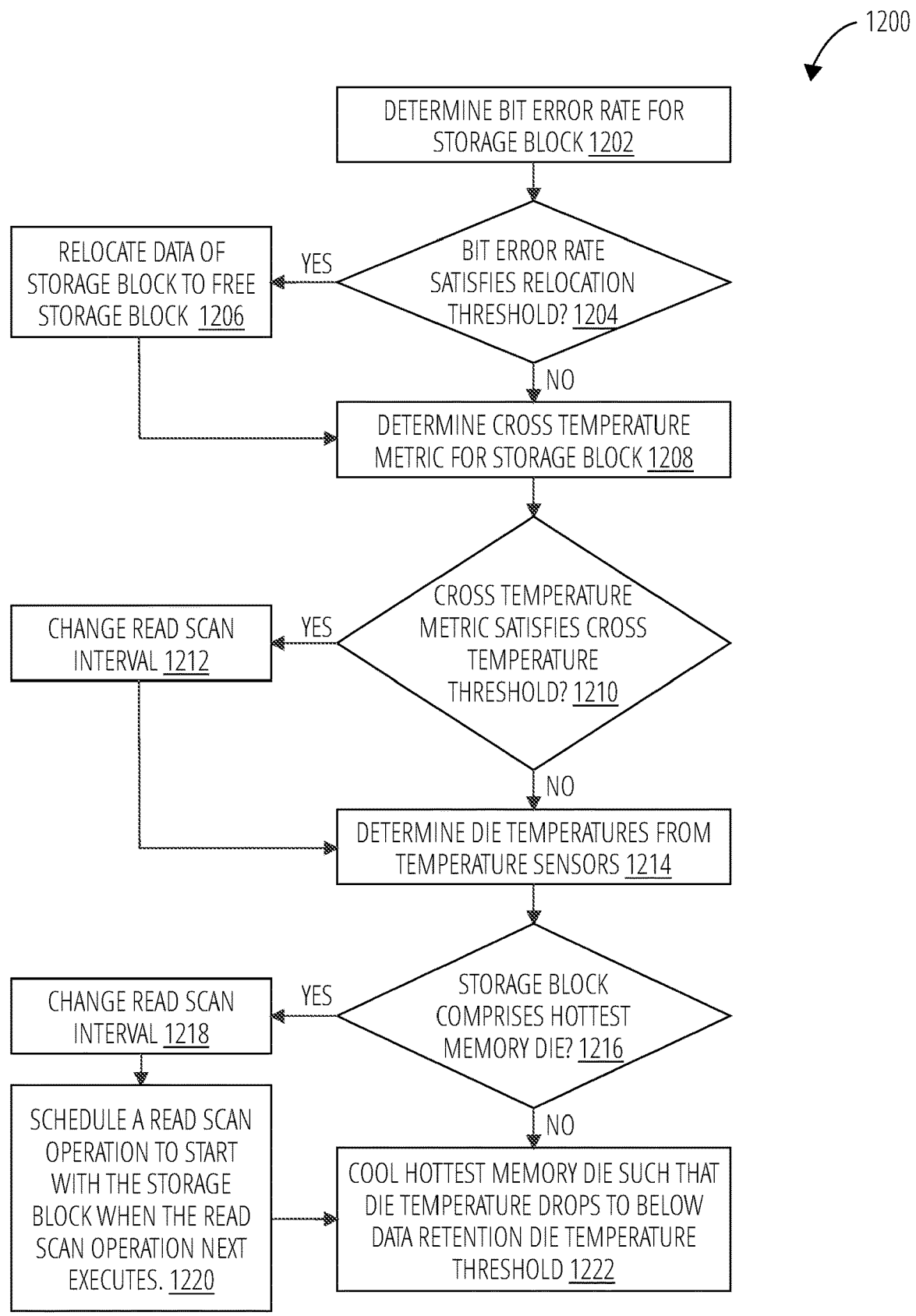
FIG. 12 illustrates a method 1200 in accordance with one embodiment.

FIG. 12 illustrates a method 1200 for dynamically changing when a read scan operation occurs in accordance with one embodiment. This method 1200 may be implemented on a storage systems such as storage system 400, storage system 600, or storage system 900. As will be evident to one of ordinary skill in the art, the order of steps may differ from that illustrated while providing equivalent functionality. The order of operations presented herein is not intended to be limiting.

An error correction code decoder of a storage controller may first determine 1202 a bit error rate for a storage block of a plurality of storage blocks of a non-volatile memory array. In one embodiment, determining the bit error rate for a storage block may comprise sampling one or more logical pages of storage cells of the storage block. The bit error rate of the sampled logical pages may be representative of the bit error rate for the storage block.

If the bit error rate satisfies 1204 a relocation threshold, a data mover may relocate 1206 data from the storage block to a free storage block. "Relocation threshold" refers to a threshold that identifies when data of a storage block is to be moved from a first storage block to a second storage block.

In one embodiment, relocating the storage block data may comprise the storage controller initiating a data scrub operation of the non-volatile memory array 106. In one embodiment, the storage controller 902 may perform a data refresh operation rather than a data scrub operation.

"Data scrub operation" refers to an operation in which valid data of a set of data blocks for a storage block is read from the storage block and stored in a new location on a non-volatile storage device, typically in non-volatile memory media. A data scrub operation leaves invalid data in the storage block and the invalid data is deleted when the storage block is erased. Once the data scrub operation successfully relocates the valid data, the data scrub operation configures the storage block to be erased.

In certain embodiments, the data scrub operation erases the storage block immediately. In other embodiments, the data scrub operation queues the storage block to be erased later. "Valid data" refers to data of a storage block that was stored by a host and should be preserved and maintained until the host indicates that the data is no longer needed, and either can, or should be, deleted. "Invalid data" refers to data stored in a storage block that a host has affirmatively deleted or has indicated is no longer needed and can be deleted because the data has been superseded by a new or changed version of the data. In non-volatile storage media comprising storage cells that are write once storage media. If data is modified by a host, the modified version of the data causes the original data stored in the write once storage media to become invalid data, the data is invalidated because it no longer represents the current version of the data.

"Data refresh operation" refers to an operation in which all data of a set of data blocks for a storage block is read from the storage block and stored in a new location on a non-volatile storage device. A data refresh operation makes no distinction and provides no different handling of invalid data and valid data of the storage block. Consequently, the data refresh operation may be faster than a data scrub operation.

Next, a cross temperature manager may determine 1208 a cross temperature metric for the storage block. If the cross temperature metric satisfies 1210 a cross temperature threshold, an adjustment module may change 1212 a read scan interval. In one embodiment, changing the read scan frequency 924 may mean decreasing a read scan interval, such that read scan operations are performed more often. In one embodiment, changing the read scan frequency 924 may mean increasing a read scan frequency, such that read scan operations are performed more often.

The storage controller may determine 1214 a hottest memory die of a plurality of memory die based on die temperature reported by each temperature sensor. The die temperature may in some embodiments be read directly from the temperature sensors by the storage controller. In another embodiment, the storage controller may access a memory location updated by another process, such as a periodic temperature scan, to include temperature sensor readings taken, for example, once a second.

If the storage block spans 1216 the hottest memory die, an adjustment module may change 1218 a read scan interval. The adjustment module may further schedule 1220 a read scan operation to start with the storage block when the read scan operation next executes. In some embodiments, the storage controller 902 cool 1222 the hottest memory die such that the die temperature drops to below a data retention die temperature threshold. A data retention die temperature threshold may comprise a threshold below which data stored on non-volatile storage media has an acceptably low bit error rate.

Figure 13:
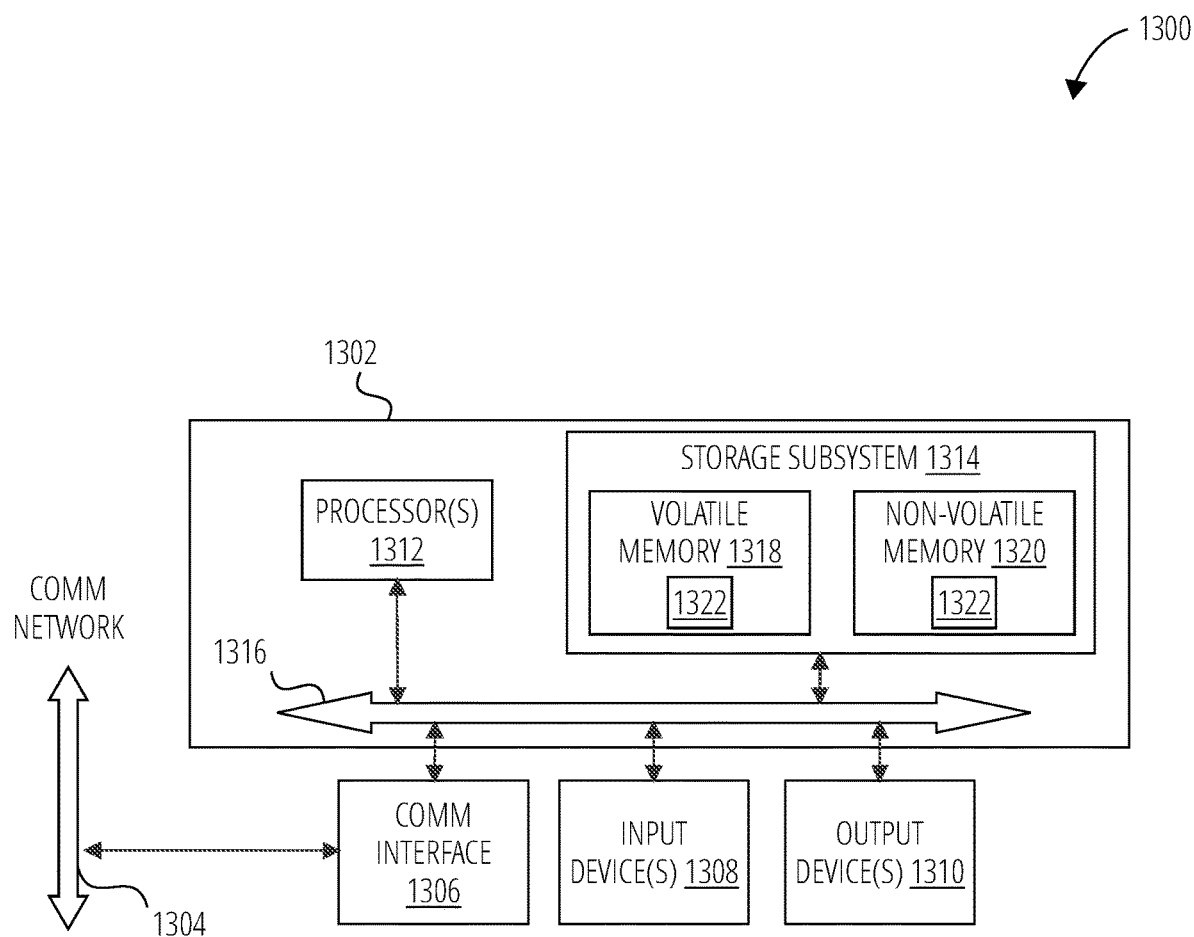
FIG. 13 is an example block diagram of a computing device 1300 that may incorporate certain embodiments.

FIG. 13 is an example block diagram of a computing device 1300 that may incorporate embodiments of the solution. FIG. 13 is merely illustrative of a machine system to carry out aspects of the technical processes described herein and does not limit the scope of the claims. One of ordinary skill in the art would recognize other variations, modifications, and alternatives. In certain embodiments, the computing device 1300 includes a data processing system 1302, a communication network 1304, communication network interface 1306, input device(s) 1308, output device(s) 1310, and the like.

As depicted in FIG. 13, the data processing system 1302 may include one or more processor(s) 1312 and a storage subsystem 1314. "Processor" refers to any circuitry, component, chip, die, package, or module configured to receive, interpret, decode, and execute machine instructions. Examples of a processor may include, but are not limited to, a central processing unit, a general-purpose processor, an application-specific processor, a graphics processing unit (GPU), a field programmable gate array (FPGA), Application Specific Integrated Circuit (ASIC), System on a Chip (SoC), virtual processor, processor core, and the like.

The processor(s) 1312 communicate with a number of peripheral devices via a bus subsystem 1316. These peripheral devices may include input device(s) 1308, output device(s) 1310, communication network interface 1306, and the storage subsystem 1314. The storage subsystem 1314, in one embodiment, comprises one or more storage devices and/or one or more memory devices.

In one embodiment, the storage subsystem 1314 includes a volatile memory 1318 and a non-volatile memory 1320. "Volatile memory" refers to a shorthand name for volatile memory media. In certain embodiments, volatile memory refers to the volatile memory media and the logic, controllers, processor(s), state machine(s), and or other periphery circuits that manage the volatile memory media and provide access to the volatile memory media. The volatile memory 1318 and/or the non-volatile memory 1320 may store computer-executable instructions that alone or together form logic 1322 that when applied to, and executed by, the processor(s) 1312 implement embodiments of the processes disclosed herein.

The input device(s) 1308 include devices and mechanisms for inputting information to the data processing system 1302. These may include a keyboard, a keypad, a touch screen incorporated into a graphical user interface, audio input devices such as voice recognition systems, microphones, and other types of input devices. In various embodiments, the input device(s) 1308 may be embodied as a computer mouse, a trackball, a track pad, a joystick, wireless remote, drawing tablet, voice command system, eye tracking system, and the like. The input device(s) 1308 typically allow a user to select objects, icons, control areas, text and the like that appear on a graphical user interface via a command such as a click of a button or the like.

The output device(s) 1310 include devices and mechanisms for outputting information from the data processing system 1302. These may include a graphical user interface, speakers, printers, infrared LEDs, and so on, as well understood in the art. In certain embodiments, a graphical user interface is coupled to the bus subsystem 1316 directly by way of a wired connection. In other embodiments, the graphical user interface couples to the data processing system 1302 by way of the communication network interface 1306. For example, the graphical user interface may comprise a command line interface on a separate computing device 1300 such as desktop, server, or mobile device.

The communication network interface 1306 provides an interface to communication networks (e.g., communication network 1304) and devices external to the data processing system 1302. The communication network interface 1306 may serve as an interface for receiving data from and transmitting data to other systems. Embodiments of the communication network interface 1306 may include an Ethernet interface, a modem (telephone, satellite, cable, ISDN), (asynchronous) digital subscriber line (DSL), Fire-Wire, USB, a wireless communication interface such as Bluetooth or WiFi, a near field communication wireless interface, a cellular interface, and the like.

The communication network interface 1306 may be coupled to the communication network 1304 via an antenna, a cable, or the like. In some embodiments, the communication network interface 1306 may be physically integrated on a circuit board of the data processing system 1302, or in some cases may be implemented in software or firmware, such as "soft modems", or the like.

The computing device 1300 may include logic that enables communications over a network using protocols such as HTTP, TCP/IP, RTP/RTSP, IPX, UDP and the like.

The volatile memory 1318 and the non-volatile memory 1320 are examples of tangible media configured to store computer readable data and instructions to implement various embodiments of the processes described herein. Other types of tangible media include removable memory (e.g., pluggable USB memory devices, mobile device SIM cards), optical storage media such as CD-ROMS, DVDs, semiconductor memories such as flash memories, non-transitory read-only-memories (ROMS), battery-backed volatile memories, networked storage devices, and the like. The volatile memory 1318 and the non-volatile memory 1320 may be configured to store the basic programming and data constructs that provide the functionality of the disclosed processes and other embodiments thereof that fall within the scope of the claimed solution.

Logic 1322 that implements one or more parts of embodiments of the solution may be stored in the volatile memory 1318 and/or the non-volatile memory 1320. Logic 1322 may be read from the volatile memory 1318 and/or non-volatile memory 1320 and executed by the processor(s) 1312. The volatile memory 1318 and the non-volatile memory 1320 may also provide a repository for storing data used by the logic 1322.

The volatile memory 1318 and the non-volatile memory 1320 may include a number of memories including a main random-access memory (RAM) for storage of instructions and data during program execution and a read only memory (ROM) in which read-only non-transitory instructions are stored. The volatile memory 1318 and the non-volatile memory 1320 may include a file storage subsystem providing persistent (non-volatile) storage for program and data files. The volatile memory 1318 and the non-volatile memory 1320 may include removable storage systems, such as removable flash memory.

The bus subsystem 1316 provides a mechanism for enabling the various components and subsystems of data processing system 1302 communicate with each other as intended. Although the communication network interface 1306 is depicted schematically as a single bus, some embodiments of the bus subsystem 1316 may utilize multiple distinct busses.

It will be readily apparent to one of ordinary skill in the art that the computing device 1300 may be a device such as a smartphone, a desktop computer, a laptop computer, a rack-mounted computer system, a computer server, or a tablet computer device. As commonly known in the art, the computing device 1300 may be implemented as a collection of multiple networked computing devices. Further, the computing device 1300 will typically include operating system logic (not illustrated) the types and nature of which are well known in the art.

Terms used herein should be accorded their ordinary meaning in the relevant arts, or the meaning indicated by their use in context, but if an express definition is provided, that meaning controls.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C. § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc., are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

What is claimed is:

1. A method, comprising:
    determining a bit error rate for a storage block of a plurality of storage blocks of a non-volatile memory array;
    determining a cross temperature metric for the storage block;
    changing a read scan interval in response to the cross temperature metric for the storage block satisfying a cross temperature threshold; and
    relocating data of the storage block to a free storage block in response to the bit error rate satisfying a relocation threshold.

2. The method of claim 1, wherein the non-volatile memory array comprises a plurality of memory die, each memory die comprising a temperature sensor, the method further comprising:
    determining that the storage block comprises a hottest memory die of the plurality of memory die based on a die temperature reported by each temperature sensor; and
    changing a read scan interval in response to determining that the storage block comprises the hottest memory die.

3. The method of claim 2, further comprising scheduling a read scan operation to start with the storage block when the read scan operation next executes.

4. The method of claim 2, further comprising cooling the hottest memory die such that the die temperature drops to below a data retention die temperature threshold.

5. The method of claim 1, determining a bit error rate for the storage block comprises sampling one or more logical pages of storage cells of the storage block, the sampled one or more logical pages of storage cells representative of the bit error rate for the storage block.

6. The method of claim 1, wherein relocating data of the storage block comprises initiating a data scrub operation by a storage controller managing the non volatile memory array.

7. The method of claim 1, wherein changing the read scan interval comprises reducing the read scan interval.

8. An apparatus, comprising:
    a read scanner configured to read data from a storage block of a plurality of storage blocks of a non-volatile memory array comprising a plurality of memory die, each memory die comprising a temperature sensor;
    an error correction code decoder configured to determine a bit error rate for the data read by the read scanner;
    a health manager configured to determine that the storage block spans a hottest memory die of the plurality of memory die based on a die temperature reported by each temperature sensor;
    a data mover configured to move data of the storage block to a free storage block in response to the bit error rate satisfying a read bit error rate threshold; and
    wherein the read scanner is configured to reduce a read scan interval for a read scan operation in response to determining that the storage block spans the hottest memory die.

9. The apparatus of claim 8, further comprising a cross temperature manager configured to:
    determine a cross temperature metric for the storage block; and
    reduce a read scan interval in response to the cross temperature metric for the storage block satisfying a cross temperature threshold.

10. The apparatus of claim 8, further comprising an adjustment module configured to:
    iteratively attempt to read data of the storage block using a predetermined number of different read levels; and
    in response to successfully reading the data of the storage block via a last of the predetermined number of different read levels in the iterative attempts, determine a bit error rate for the data of the storage block read and reduce the read scan interval in response to the bit error rate satisfying the read bit error rate threshold.

11. The apparatus of claim 10, wherein the adjustment module is further configured to schedule the read scan operation to start with the storage block when the read scan operation next executes.

12. The apparatus of claim 8, further comprising a storage controller configured to cool the hottest memory die of the plurality of memory die.

13. The apparatus of claim 12, wherein the storage controller cools the hottest memory die by directing incoming write commands to one or more storage block that do not include the hottest memory die.

14. The apparatus of claim 12, wherein the storage controller cools the hottest memory die by directing the data mover to move data for each storage block that spans the hottest memory die to another plurality of storage blocks and temporarily stop using the hottest memory die such that the hottest memory die cools due to nonuse.

15. An apparatus, comprising:

a plurality of storage blocks;

a storage controller configured to:
- determine a storage block of the plurality of storage blocks having a bit error rate above a read bit error rate threshold;
- iteratively read data of the storage block using a predetermined number of different read levels;
- in response to successfully reading the data of the storage block via the iterative reads, changing one or more read levels of the storage block to one or more of the predetermined number of different read levels used to successfully read the data of the storage block; and
- increase a read scan frequency of the plurality of storage blocks in response to changing the one or more read levels; and a cross temperature manager configured to:
- determine a cross temperature metric for the storage block; and
- change the read scan frequency in response to the cross temperature metric for the storage block satisfying a cross temperature threshold.

16. The apparatus of claim 15, wherein the cross temperature manager determines the cross temperature metric by:
- determining a write temperature for the data of the storage block;
- determining a current temperature for the storage block; and
- setting the cross temperature metric as a difference between the write temperature and the current temperature.

17. An apparatus, comprising:

a plurality of storage blocks;

a storage controller configured to:
- determine a storage block of the plurality of storage blocks having a bit error rate above a read bit error rate threshold, wherein each storage block of the plurality of storage blocks spans a plurality of memory die;
- iteratively read data of the storage block using a predetermined number of different read levels;
- in response to successfully reading the data of the storage block via the iterative reads, changing one or more read levels of the storage block to one or more of the predetermined number of different read levels used to successfully read the data of the storage block; and
- increase a read scan frequency of the plurality of storage blocks in response to changing the one or more read levels; and a health manager configured to:
- in response to iteratively attempting to read the data of the storage block, determine that the storage block comprises a hottest memory die of the plurality of memory die based on a die temperature for each memory die the storage block spans; and
- change the read scan frequency in response to determining that the storage block comprises the hottest memory die.

18. The apparatus of claim 17, wherein the health manager is further configured to queue the storage block that includes the hottest memory die as a next storage block for a subsequent read scan operation.

19. The apparatus of claim 17, wherein the storage controller is configured to reconfigure the storage block to exclude the hottest memory die.

* * * * *